US012777791B2

(12) United States Patent
Chen et al.

(10) Patent No.: US 12,777,791 B2
(45) Date of Patent: Oct. 27, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yipeng Chen, Beijing (CN); Ling Shi, Beijing (CN)

(73) Assignees: CHENGDU BOE OPTOELECTRONICS TECHNOLOGY CO., LTD., Chengdu (CN); Beijing BOE Technology Development Co., Ltd., Beijing (CN)

( * ) Notice: Subject to any disclaimer, the term of this patent is extended or adjusted under 35 U.S.C. 154(b) by 418 days.

(21) Appl. No.: 18/288,704

(22) PCT Filed: May 25, 2022

(86) PCT No.: PCT/CN2022/094874

§ 371 (c)(1),
(2) Date: Oct. 27, 2023

(87) PCT Pub. No.: WO2023/225889

PCT Pub. Date: Nov. 30, 2023

(65) Prior Publication Data

US 2025/0081766 A1 Mar. 6, 2025

(51) Int. Cl.

| | |
|---|---|
| ***H01L 29/08*** | (2006.01) |
| ***H10K 59/123*** | (2023.01) |
| ***H10K 59/131*** | (2023.01) |

(52) U.S. Cl.

CPC ......... *H10K 59/131* (2023.02); *H10K 59/123* (2023.02)

(58) Field of Classification Search

CPC ............... H10K 59/131; H10K 59/123; H10K 59/1213; H10K 59/1216; H10K 59/126;

(Continued)

(56) References Cited

U.S. PATENT DOCUMENTS

| | | | |
|---|---|---|---|
| 7,843,221 | B2 | 11/2010 | Jinta |
| 8,264,426 | B2 | 9/2012 | Chung |

(Continued)

FOREIGN PATENT DOCUMENTS

| | | | |
|---|---|---|---|
| CN | 100419835 | C | 9/2008 |
| CN | 100514419 | C | 7/2009 |

(Continued)

OTHER PUBLICATIONS

Extended European search report dated Apr. 7, 2025 received in European Patent Application No. 22943094.7.

*Primary Examiner* — Niki H Nguyen

(74) *Attorney, Agent, or Firm* — Scully, Scott, Murphy & Presser, P.C.

(57) ABSTRACT

A display substrate and a display device are provided. In the display substrate, the plurality of signal lines includes a first initialization signal line, a reset control signal line, and a second initialization signal line. The plurality of transistors include a first reset transistor and a second reset transistor, a gate electrode of the first reset transistor and a gate electrode of the second reset transistor are electrically connected with the reset control signal line, an orthographic projection of at least one of the first initialization signal line and the second initialization signal line on the base substrate does not overlap with an orthographic projection of the reset control signal line on the base substrate.

20 Claims, 9 Drawing Sheets

(58) Field of Classification Search
CPC ............... H10K 59/122; H10K 59/124; H10K 59/8723; H10K 59/35; H10K 59/352; H10K 59/351; H10K 59/60; H10K 59/40; H10K 2102/311; H10K 59/00; H10K 65/00; H10K 59/10; H10K 59/873; H10D 86/60; H10D 86/441; H10D 86/40; H10D 86/021; H10D 86/425; H01L 21/77; H01L 25/0753; H01L 25/167; H01L 21/027; H10H 29/10; H10H 20/857; H10H 20/831; H10H 20/819; H10H 20/824; H10H 20/8316; H10H 29/142
See application file for complete search history.

(56) References Cited

U.S. PATENT DOCUMENTS

| | | | | |
|---|---|---|---|---|
| 8,310,470 | B2 | 11/2012 | Toyoshima et al. | |
| 9,424,780 | B2 | 8/2016 | Wang | |
| 9,495,905 | B2 | 11/2016 | Omata et al. | |
| 10,319,804 | B2 | 6/2019 | Wang | |
| 10,803,802 | B2 | 10/2020 | Song et al. | |
| 10,985,185 | B2 | 4/2021 | Yuan | |
| 11,049,458 | B1 | 6/2021 | Fan et al. | |
| 11,169,631 | B2 | 11/2021 | Li et al. | |
| 11,195,897 | B2 | 12/2021 | Wang et al. | |
| 11,282,436 | B2 | 3/2022 | Gai | |
| 11,393,396 | B2 | 7/2022 | Yang et al. | |
| 11,699,710 | B2 | 7/2023 | Cai et al. | |
| 11,805,682 | B2 | 10/2023 | Chen et al. | |
| 11,900,873 | B2 | 2/2024 | Yuan et al. | |
| 11,922,879 | B2 * | 3/2024 | Gao | G09G 3/3233 |
| 11,955,071 | B2 | 4/2024 | Zhao et al. | |
| 2016/0275869 | A1 | 9/2016 | Hwang et al. | |
| 2018/0190195 | A1 | 7/2018 | Asano | |
| 2019/0130832 | A1 | 5/2019 | Chang | |
| 2020/0184893 | A1 | 6/2020 | Dong | |
| 2021/0056894 | A1 * | 2/2021 | Yang | G09G 3/3233 |
| 2021/0134917 | A1 | 5/2021 | Li et al. | |
| 2021/0280132 | A1 * | 9/2021 | Gao | G09G 3/3233 |
| 2021/0359075 | A1 | 11/2021 | Liu et al. | |
| 2023/0038017 | A1 * | 2/2023 | Wei | G09G 3/3233 |
| 2023/0097504 | A1 | 3/2023 | Liu | |
| 2023/0108752 | A1 | 4/2023 | Xu et al. | |
| 2023/0186850 | A1 | 6/2023 | Wang et al. | |
| 2023/0360599 | A1 | 11/2023 | Liu et al. | |

FOREIGN PATENT DOCUMENTS

| | | | | |
|---|---|---|---|---|
| CN | 1901017 | B | 6/2011 | |
| CN | 101510402 | B | 9/2011 | |
| CN | 101540139 | B | 7/2012 | |
| CN | 102270425 | B | 7/2013 | |
| CN | 102290027 | B | 10/2013 | |
| CN | 103778886 | A | 5/2014 | |
| CN | 103531106 | B | 6/2015 | |
| CN | 103247262 | B | 9/2015 | |
| CN | 205508358 | U | 8/2016 | |
| CN | 104715714 | B | 8/2017 | |
| CN | 108288455 | A | 7/2018 | |
| CN | 109326633 | A | 2/2019 | |
| CN | 109686311 | A | 4/2019 | |
| CN | 109742092 | A | 5/2019 | |
| CN | 109860259 | A | 6/2019 | |
| CN | 108206008 | B | 12/2019 | |
| CN | 110619850 | A | 12/2019 | |
| CN | 109166524 | B | 3/2020 | |
| CN | 108269526 | B | 5/2020 | |
| CN | 111179828 | A | 5/2020 | |
| CN | 111199709 | A | 5/2020 | |
| CN | 111243493 | A | 6/2020 | |
| CN | 111243501 | A | 6/2020 | |
| CN | 111243503 | A | 6/2020 | |
| CN | 111312162 | A | 6/2020 | |
| CN | 111326112 | A | 6/2020 | |
| CN | 111354307 | A | 6/2020 | |
| CN | 111383596 | A | 7/2020 | |
| CN | 111429842 | A | 7/2020 | |
| CN | 109634466 | B | 11/2020 | |
| CN | 112331681 | A | 2/2021 | |
| CN | 112397029 | A | 2/2021 | |
| CN | 111179859 | B | 3/2021 | |
| CN | 112436042 | A | 3/2021 | |
| CN | 112366226 | B | 4/2021 | |
| CN | 110660360 | B | 5/2021 | |
| CN | 110867160 | B | 5/2021 | |
| CN | 111312174 | B | 5/2021 | |
| CN | 113078199 | A | 7/2021 | |
| CN | 113205773 | A | 8/2021 | |
| CN | 113224123 | A | 8/2021 | |
| CN | 113253530 | A | 8/2021 | |
| CN | 113257881 | A | 8/2021 | |
| CN | 113270470 | A | 8/2021 | |
| CN | 113674693 | A | 11/2021 | |
| CN | 113689825 | A | 11/2021 | |
| CN | 113764438 | A | 12/2021 | |
| CN | 114361186 | A | 4/2022 | |
| JP | 2005338591 | A | 12/2005 | |
| JP | 2010097051 | A | 4/2010 | |
| WO | 2020233024 | A1 | 11/2020 | |
| WO | 2021103406 | A1 | 6/2021 | |
| WO | WO-2021184274 | A1 * | 9/2021 | H10D 86/60 |

* cited by examiner

DISPLAY SUBSTRATE AND DISPLAY DEVICE

CROSS-REFERENCE TO RELATED APPLICATION

This application is a U.S. National Phase of International Application No. PCT/CN2022/094874, filed on May 25, 2022, the entire disclosure of which is incorporated herein by reference as part of the present application.

TECHNICAL FIELD

The embodiments of the present disclosure relate to a display substrate and a display device.

BACKGROUND

At present, in a field of display technology, according to a manufacture technology and a material classification of a thin film transistor (TFT), the TFT can include an amorphous silicon (a-Si) TFT, a low temperature polysilicon (LTP) TFT, an oxide (for example, Indium Gallium Zinc Oxide (IGZO)) TFT and the like. The LTPS TFT is manufactured based on a low-temperature polysilicon process, which can achieve smaller drive current and lower drive voltage; the oxide TFT is manufactured based on an oxide process, which can achieve a lower refresh rate. Low temperature polycrystalline oxide (LTPO) is a low power consumption display technology. The LTPO technology integrates the low-temperature polysilicon process and the oxide process, and prepares the LTPS TFT and the oxide TFT in a display panel, which combines advantages of the LTPS TFT and advantages of the oxide TFT, so as to furthest use an advantage of ultra-high mobility rate of the low-temperature polysilicon and an advantage of small leakage current of the oxide to achieve better display performance.

SUMMARY

At least one embodiment of the present disclosure provides a display substrate and a display device.

At least one embodiment of the present disclosure provides a display substrate, including: a base substrate; a plurality of sub-pixels, located on the base substrate, each of the plurality of sub-pixels including a light-emitting element and a pixel circuit, the pixel circuit being configured to drive the light-emitting element, the pixel circuit including a plurality of transistors and a storage capacitor, each of the plurality of transistors including a gate electrode, a first electrode, and a second electrode; a plurality of signal lines, arranged on the base substrate, including a first initialization signal line, a reset control signal line, and a second initialization signal line which extend in a first direction and are arranged in a second direction, the reset control signal line being configured to supply a reset control signal to the pixel circuit, the first initialization signal line being configured to supply a first initialization signal to the pixel circuit, and the second initialization signal line being configured to supply a second initialization signal to the pixel circuit, the second direction intersecting with the first direction; the plurality of transistors including a first reset transistor and a second reset transistor; a first electrode of the first reset transistor is electrically connected with the first initialization signal line, and a gate electrode of the first reset transistor and a gate electrode of the second reset transistor are electrically connected with the reset control signal line, a first electrode of the second reset transistor is electrically connected with the second initialization signal line, and a second electrode of the second reset transistor is electrically connected with the light-emitting element, an orthographic projection of at least one of the first initialization signal line and the second initialization signal line on the base substrate does not overlap with an orthographic projection of the reset control signal line on the base substrate.

For example, in the display substrate provided by at least one embodiment of the present disclosure, the plurality of transistors further include a driving transistor, a first light-emitting control transistor, and a second light-emitting control transistor, and the plurality of signal lines further include a light-emitting control signal line, the light-emitting control signal line extends in the first direction, a first electrode of the first light-emitting control transistor is electrically connected with a second electrode of the storage capacitor, a first electrode of the second light-emitting control transistor is electrically connected with the second electrode of the second reset transistor, and a gate electrode of the first light-emitting control transistor and a gate electrode of the second light-emitting control transistor are electrically connected with the light-emitting control signal line, and a second electrode of the second light-emitting control transistor and a second electrode of the first light-emitting control transistor are connected with a first electrode and a second electrode of the driving transistor, respectively, and a gate electrode of the driving transistor is connected with a first electrode of the storage capacitor, an orthographic projection of the first initialization signal line on the base substrate at least partially overlaps with an orthographic projection of the light-emitting control signal line on the base substrate.

For example, in the display substrate provided by at least one embodiment of the present disclosure, the plurality of transistors further include a refresh control transistor, a first electrode of the refresh control transistor is electrically connected with a first electrode of the storage capacitor, a second electrode of the refresh control transistor is electrically connected with a second electrode of the first reset transistor, the plurality of signal lines further include a refresh gate line, the refresh gate line extends in the first direction, a gate electrode of the refresh control transistor is electrically connected with the refresh gate line, and the orthographic projection of the second initialization signal line on the base substrate at least partially overlaps with an orthographic projection of the refresh gate line on the base substrate.

For example, in the display substrate provided by at least one embodiment of the present disclosure, the first initialization signal line and the second initialization signal line are arranged to be spaced apart in the second direction.

For example, in the display substrate provided by at least one embodiment of the present disclosure, the orthographic projection of the reset control signal line on the base substrate does not overlap with an orthographic projection of a signal line of the plurality of signal lines extending in the first direction on the base substrate.

For example, in the display substrate provided by at least one embodiment of the present disclosure, the plurality of signal lines further include a scan control signal line, the scan control signal line extends in the first direction; the plurality of transistors further include a compensation transistor and a data writing transistor, and the scan control signal line is electrically connected with a gate electrode of the compensation transistor and a gate electrode of the data writing transistor, respectively, in the second direction, the reset control signal line, the refresh gate line, and the scan control signal line are arranged sequentially, and the orthographic projection of the second initialization signal line on the base substrate does not overlap with an orthographic projection of the scan control signal line on the base substrate.

For example, in the display substrate provided by at least one embodiment of the present disclosure, in the second direction, the first initialization signal line, the reset control signal line, the second initialization signal line, the scan control signal line, and the storage capacitor are sequentially arranged at intervals, and a minimum spacing between the reset control signal line and the second initialization signal line is greater than a minimum spacing between the refresh gate line and the storage capacitor.

For example, in the display substrate provided by at least one embodiment of the present disclosure, the first initialization signal line includes a first body portion and at least one first connection portion, the first body portion extends in the first direction, and an orthographic projection of the first body portion on the base substrate at least partially overlaps with the orthographic projection of the light-emitting control signal line on the base substrate, the at least one first connection portion is connected with the first body portion, in the second direction, an orthographic projection of the at least one first connection portion on the base substrate is located between the orthographic projection of the light-emitting control signal line on the base substrate and the orthographic projection of the reset control signal line on the base substrate.

For example, in the display substrate provided by at least one embodiment of the present disclosure, the pixel circuit includes an active pattern, the active pattern includes a channel region and a source and drain region of the transistor, and the active pattern includes a plurality of active portions, and each of the plurality of active portions includes a first end and a second end located on both sides of the channel region.

For example, in the display substrate provided by at least one embodiment of the present disclosure, the plurality of active portions include a first active portion, the first active portion extends in the second direction, a first end of the first active portion serves as the first electrode of the first reset transistor, a second end of the first active portion serves as a second electrode of the first reset transistor, and an orthographic projection of first active portion on the base substrate does not overlap with the orthographic projection of the first body portion of the first initialization signal line on the base substrate.

For example, in the display substrate provided by at least one embodiment of the present disclosure, the plurality of active portions further include a second active portion, the second active portion extends in the second direction, a first end of the second active portion serves as the first electrode of the first light-emitting control transistor, and an orthographic projection of the second active portion on the base substrate at least partially overlap with the orthographic projection of the first body portion of the first initialization signal line on the base substrate.

For example, in the display substrate provided by at least one embodiment of the present disclosure, the second initialization signal line includes a second body portion and a second connection portion, the second body portion extends in the first direction, one end of the second connection portion is connected with the second body portion, the second connection portion extends in the second direction, and in the second direction, the second connection portion of the second initialization signal line is located on a side of the reset control signal line that is closest to the second body portion of the second initialization signal line.

For example, in the display substrate provided by at least one embodiment of the present disclosure, the second body portion includes a first bent portion, the reset control signal line includes a second bent portion, in the second direction, the first bent portion is bent toward the reset control signal line that is closest thereto, and the second bent portion is bent toward the light-emitting control signal line that is closest thereto, and a bent direction of the first bent portion is the same as a bent direction of the second bent portion.

For example, in the display substrate provided by at least one embodiment of the present disclosure, the second connection portion includes a first combination portion and a second combination portion that are opposite to each other, the plurality of active portions further include a third active portion, the third active portion extends in the second direction, and a first end of the third active portion serves as the first electrode of the second reset transistor, a second end of the third active portion serves as the second electrode of the second reset transistor, the first combination portion is connected with the first bent portion, and the second combination portion is electrically connected with the first end of the third active portion.

For example, in the display substrate provided by at least one embodiment of the present disclosure, in the second direction, the first initialization signal line is located between the first electrode of the first reset transistor and the storage capacitor, and the orthographic projection of the first initialization signal line on the base substrate does not overlap with an orthographic projection of the storage capacitor on the base substrate.

For example, in the display substrate provided by at least one embodiment of the present disclosure, the pixel circuit further includes an active component, the active component extends in the second direction, the refresh gate line includes a first refresh gate sub-line and a second refresh gate sub-line, the first refresh gate sub-line and the second refresh gate sub-line both extend in the first direction, and in a direction perpendicular to the base substrate, the first refresh gate sub-line, the active component, and the second refresh gate sub-line are arranged sequentially, and the second refresh gate sub-line is located on a side of the active component away from the base substrate; an orthographic projection of the first refresh gate sub-line on the base substrate at least partially overlaps with an orthographic projection of the active component on the base substrate to form a first overlap region, an orthographic projection of the second refresh gate sub-line on the base substrate at least partially overlaps with an orthographic projection of the first overlap region on the base substrate to form a second overlap region, a portion of the first refresh gate sub-line and a portion of the second refresh gate sub-line that are located in the second overlap region serve as a top gate electrode and a bottom gate electrode of the gate electrode of the refresh control transistor, respectively, and the orthographic projection of the second initialization signal line on the base substrate at least partially overlaps with an orthographic projection of the second overlap region on the base substrate.

For example, the display substrate provided by at least one embodiment of the present disclosure further includes: a first conductive layer, a second conductive layer, a third conductive layer, a first connection layer, and a second connection layer, the active pattern is arranged on the base substrate, the first conductive layer, the second conductive layer, the third conductive layer, the first connection layer, and the second connection layer are sequentially arranged on a side of the active pattern away from the base substrate in a direction perpendicular to the base substrate, the light-emitting control signal line, the reset control signal line, the scan control signal line, and the first electrode of the storage capacitor are located in the first conductive layer; the first refresh gate sub-line and the second electrode of the storage capacitor are located in the second conductive layer; the first initialization signal line and the second refresh gate sub-line are located in the third conductive layer; the second initialization signal line is located in the first connection layer; the display substrate further includes a plurality of data lines and a plurality of power supply signal lines, and the plurality of data lines and the plurality of power supply signal lines are in the same layer as the second connection layer.

For example, in the display substrate provided by at least one embodiment of the present disclosure, both the first connection layer and the second connection layer include a plurality of connection electrodes, the first connection layer includes a first connection electrode, the second connection layer includes a second connection electrode, and the first connection electrode and the second connection electrode are electrically connected through a first via hole, and the second connection electrode is electrically connected with the light-emitting element through a second via hole, the second electrode of the second reset transistor is connected with the first connection electrode through a third via hole, and is further electrically connected with the light-emitting element.

For example, in the display substrate provided by at least one embodiment of the present disclosure, an overlap area between the orthographic projection of the first initialization signal line on the base substrate and orthographic projections of the first connection electrode and the second connection electrode on the base substrate is less than 5% of an area of an orthographic projection of the first connection electrode on the base substrate.

For example, in the display substrate provided by at least one embodiment of the present disclosure, the first connection layer further includes a third connection electrode, a fourth connection electrode, a fifth connection electrode, a sixth connection electrode, a seventh connection electrode, and an eighth connection electrode, the second connection layer further includes a ninth connection electrode, the first initialization signal line is electrically connected with the third connection electrode through a fourth via hole, the first electrode of the first reset transistor is electrically connected with the third connection electrode through a fifth via hole, and the second electrode of the refresh control transistor is electrically connected with the fourth connection electrode through a sixth via hole, and the second electrode of the first reset transistor is electrically connected with the fourth connection electrode through a seventh via hole; a first electrode of the compensation transistor is electrically connected with the second electrode of the refresh control transistor through the sixth via hole, and an orthographic projection of the fourth connection electrode on the base substrate at least partially overlaps with the orthographic projection of the second initialization signal line on the base substrate; the gate electrode of the driving transistor is electrically connected with the storage capacitor and the fifth connection electrode through an eighth via hole, and the first electrode of the refresh control transistor is electrically connected with the fifth connection electrode through a ninth via hole; the data writing transistor is electrically connected with the sixth connection electrode through a tenth via hole, the sixth connection electrode is electrically connected with the data line through an eleventh via hole, an orthographic projection of the sixth connection electrode on the base substrate does not overlap with the orthographic projection of the second initialization signal line on the base substrate; the first light-emitting control transistor is electrically connected with the seventh connection electrode through a twelfth via hole, and the seventh connection electrode is electrically connected with the power supply signal line through a thirteenth via hole, and an orthographic projection of the thirteenth via hole on the base substrate at least partially overlaps with the orthographic projection of the first initialization signal line on the base substrate; the first electrode of the second light-emitting control transistor is electrically connected with the eighth connection electrode through a fourteenth via hole, and the eighth connection electrode is electrically connected with the ninth connection electrode through a fifteenth via hole, the ninth connection electrode is electrically connected with the light-emitting element through a sixteenth via hole, and orthographic projections of the eighth connection electrode and the ninth connection electrode on the base substrate substantially do not overlap with the orthographic projection of the first initialization signal line on the base substrate.

For example, in the display substrate provided by at least one embodiment of the present disclosure, in the second direction, the fourth via hole, the fifth via hole, the twelfth via hole, the fourteenth via hole, and the fifteenth via hole are located between the light-emitting control signal line and the reset control signal line; the sixth via hole, the seventh via hole, the tenth via hole, and the eleventh via hole are located between the reset control signal line and the second initialization signal line; the ninth via hole is located between the second initialization signal line and the storage capacitor, and an orthographic projection of the ninth via hole on the base substrate at least partially overlaps with an orthographic projection of the scan control signal line on the base substrate.

At least one embodiment of the present disclosure provides a display substrate, including: a base substrate; a plurality of sub-pixels, located on the base substrate, wherein each of the plurality of sub-pixels includes a light-emitting element and a pixel circuit, the pixel circuit is configured to drive the light-emitting element, the pixel circuit includes a plurality of transistors and a storage capacitor, the transistor includes a gate electrode, a first electrode, and a second electrode; a plurality of signal lines, arranged on the base substrate, including an initialization signal line and a reset control signal line, wherein the initialization signal line is configured to supply an initialization signal to the pixel circuit, and the reset control signal line is configured to supply a reset control signal to the pixel circuit; the plurality of transistors include a reset transistor, a gate electrode of the reset transistor is connected with the reset control signal line, a first electrode of the reset transistor is connected with the initialization signal line, and the reset transistor is configured to reset a first electrode of the storage capacitor or a first electrode of the light-emitting element, an orthographic projection of the initialization signal line on the base substrate does not overlap with an orthographic projection of the reset control signal line on the base substrate.

For example, in the display substrate provided by at least one embodiment of the present disclosure, the initialization signal line includes a first initialization signal line, the first reset transistor is configured to reset the first electrode of the storage capacitor, an orthographic projection of the first initialization signal line on the base substrate does not overlap with the orthographic projection of the reset control signal line on the base substrate.

For example, in the display substrate provided by at least one embodiment of the present disclosure, the reset transistor includes a second reset transistor, the initialization signal line includes a second initialization signal line, the second reset transistor is configured to reset the first electrode of the light-emitting element, and an orthographic projection of the second initialization signal line on the base substrate does not overlap with the orthographic projection of the reset control signal line on the base substrate.

For example, in the display substrate provided by at least one embodiment of the present disclosure, the plurality of transistors further include a refresh control transistor, a first electrode of the refresh control transistor is electrically connected with the first electrode of the storage capacitor, and a second electrode of the refresh control transistor is connected with a second electrode of the first reset transistor, the plurality of signal lines further include a refresh gate line, the refresh gate line extends in a first direction, and a gate electrode of the refresh control transistor is electrically connected with the refresh gate line; the orthographic projection of the second initialization signal line on the base substrate at least partially overlaps with an orthographic projection of the refresh gate line on the base substrate.

For example, in the display substrate provided by at least one embodiment of the present disclosure, the plurality of transistors further include a driving transistor and a light-emitting control transistor, and the plurality of signal lines further include a light-emitting control signal line, and the light-emitting control signal line extends in a first direction, a first electrode of the light-emitting control transistor is electrically connected with a second electrode of the second reset transistor, a gate electrode of the light-emitting control transistor is electrically connected with the light-emitting control signal line, and a second electrode of the light-emitting control transistor is connected with the driving transistor, the orthographic projection of the first initialization signal line on the base substrate at least partially overlaps with an orthographic projection of the light-emitting control signal line on the base substrate.

At least one embodiment of the present disclosure provides a display device, including any one of the display substrates as described above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1A:
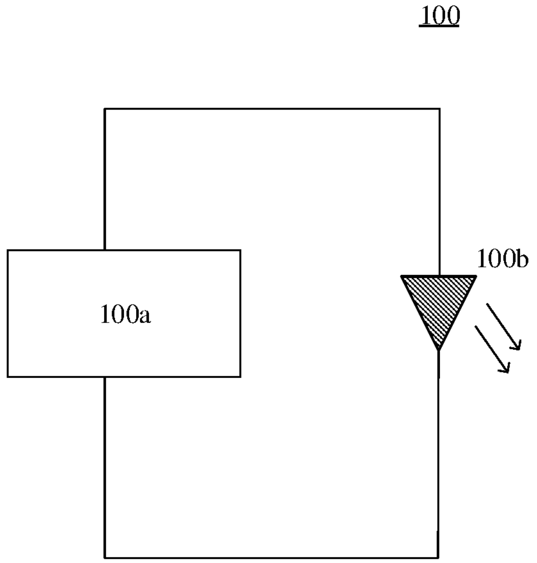
FIG. 1A is a schematic diagram of a sub-pixel in a display substrate provided by at least one embodiment of the present disclosure.

For more clear understanding of the objectives, technical details and advantages of the embodiments of the present disclosure, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms “first,” “second,” etc., which are used in the present disclosure, are not intended to indicate any sequence, amount or importance, but distinguish various components. Also, the terms “comprise”, “comprising”, “include”, “including”, etc., are intended to specify that the elements or the objects stated before these terms encompass the elements or the objects and equivalents thereof listed after these terms, but do not preclude the other elements or objects. The phrases “connect”, “connected” and the like are not limited to a physical or mechanical connection, but also include an electrical connection, either directly or indirectly. “On,” “under,” “right,” “left” and the like are only used to indicate relative position relationship, and when the position of the described object is changed, the relative position relationship may be changed accordingly.

In order to keep the following description of the embodiments of the present disclosure clear and concise, detailed descriptions of some known functions and known components are omitted in the present disclosure.

An LTPO technology can be applied to an organic light-emitting diode display panel, thereby reducing power consumption of the display panel. The power consumption of the display panel includes driving power and light-emitting power. A display panel based on the LTPO technology has lower driving power than a display panel based on an LTPS technology. The display panel based on the LTPS technology require 60 hertz (Hz) to display a static image, but the display panel based on the LTPO technology can reduce the driving power to 1 Hz to display the static image, thereby greatly reducing driving power.

Based on the LTPO technology, some transistors in the display panel are oxide transistors (for example, a N-type oxide transistor), the oxide transistor has less leakage current and can keep a voltage (charge) of the capacitor for one second to achieve 1 Hz refresh frequency. The LTPS transistor has a large leakage current, and requires 60 Hz even to drive a static pixel; otherwise, brightness of the display panel will be drastically reduced.

Initially, the LTPO technology was applied to a smart watch. An efficiency of the LTPO has been greatly demonstrated in the smart watch. Because a black region on a screen of the smart watch is wide, light-emitting power is low. Based on the LTPO technology, a ratio of a driving power to the light-emitting power of the smart watch is about 6:4. The LTPO technology can reduce an existing driving power to one-third, resulting in a 40% reduction in overall power consumption.

In order to achieve a refresh frequency of 1 Hz, the LTPO technology usually adopts a design of which two initialization signal lines are used to supply a dual initialization signal (dual Vinit). Therefore, under a requirement of a high PPI layout, a space layout design for the LTPO technology is particularly important.

Based on a driving principle of LTPO technology, various signal control operations can be performed during a time period during which a reset control signal in a pixel circuit is at a low level, for example, some signal writing operations can be performed. Therefore, generally in a process of controlling the pixel circuit, it is more beneficial to signal control to prolong the time period during which the reset control signal is at the low level as much as possible. For example, for the reset control signal, the low level may correspond to a turn-on state of a corresponding transistor in the pixel circuit, and a high level may correspond to a turn-off state. At the same time, a load on a reset control signal line directly determines threshold compensation effect of a driving transistor, and the smaller the load on the reset control signal line, the better the threshold compensation effect of the driving transistor.

Based on this, inventor(s) of the present disclosure found that in a common display substrate, in a case where two initialization signal lines overlap with the reset control signal line that supplies the reset control signal, the load on the reset control signal line is relatively large, which is easy to cause display defects under a low grayscale, which is not conducive to brightness uniformity in high frequency driving.

In order to better realize a signal control of an LTPO pixel circuit, the load of the reset control signal can be reduced as much as possible.

At least one embodiment of the present disclosure provides a display substrate, and the display substrate includes: a base substrate, a plurality of sub-pixels, and a plurality of signal lines. The plurality of sub-pixels are located on the base substrate, the sub-pixel includes a light-emitting element and a pixel circuit, the pixel circuit is configured to drive the light-emitting element, the pixel circuit includes a plurality of transistors and a storage capacitor, and the transistor includes a gate electrode, a first electrode, and a second electrode; the plurality of signal lines are arranged on the base substrate, and include a first initialization signal line, a reset control signal line, and a second initialization signal line which extend in a first direction and are arranged in a second direction, the reset control signal line is configured to supply a reset control signal to the pixel circuit, the first initialization signal line is configured to supply a first initialization signal to the pixel circuit, and the second initialization signal line is configured to supply a second initialization signal to the pixel circuit, the second direction intersects with the first direction; the plurality of transistors include a first reset transistor and a second reset transistor, a first electrode of the first reset transistor is electrically connected with the first initialization signal line, and a gate electrode of the first reset transistor and a gate electrode of the second reset transistor are electrically connected with the reset control signal line, a first electrode of the second reset transistor is electrically connected with the second initialization signal line, and a second electrode of the second reset transistor is electrically connected with the light-emitting element, an orthographic projection of at least one of the first initialization signal line and the second initialization signal line on the base substrate does not overlap with an orthographic projection of the reset control signal line on the base substrate.

In the display substrate provided by the embodiments of the present disclosure, structure of the pixel circuit is optimized based on the LTPO technology, by reducing a signal line whose orthographic projection on the base substrate overlapping with the orthographic projection of the reset control signal line on the base substrate, the load on the reset control signal line can be reduced, which is helpful for alleviating the display defects (for example, Mura) under the low grayscale, and improving brightness uniform of high-frequency driving, and improving display quality; at the same time, this scheme makes a layout of the pixel circuit is more reasonable and easy to implement.

At least one embodiment of the present disclosure further provides a display device corresponding to the display substrate described above.

The embodiments of the present disclosure will be described in detail below with reference to the drawings, but the present disclosure is not limited to these specific embodiments.

Figure 1B:
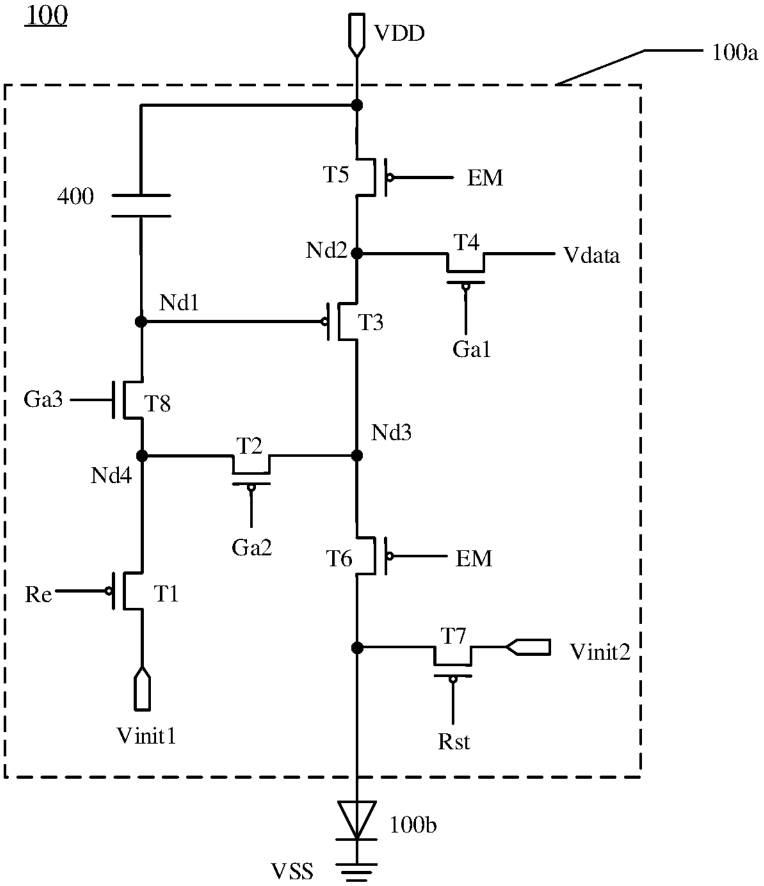
FIG. 1B is a schematic circuit diagram of a sub-pixel in a display substrate provided by at least one embodiment of the present disclosure.
Figure 2:
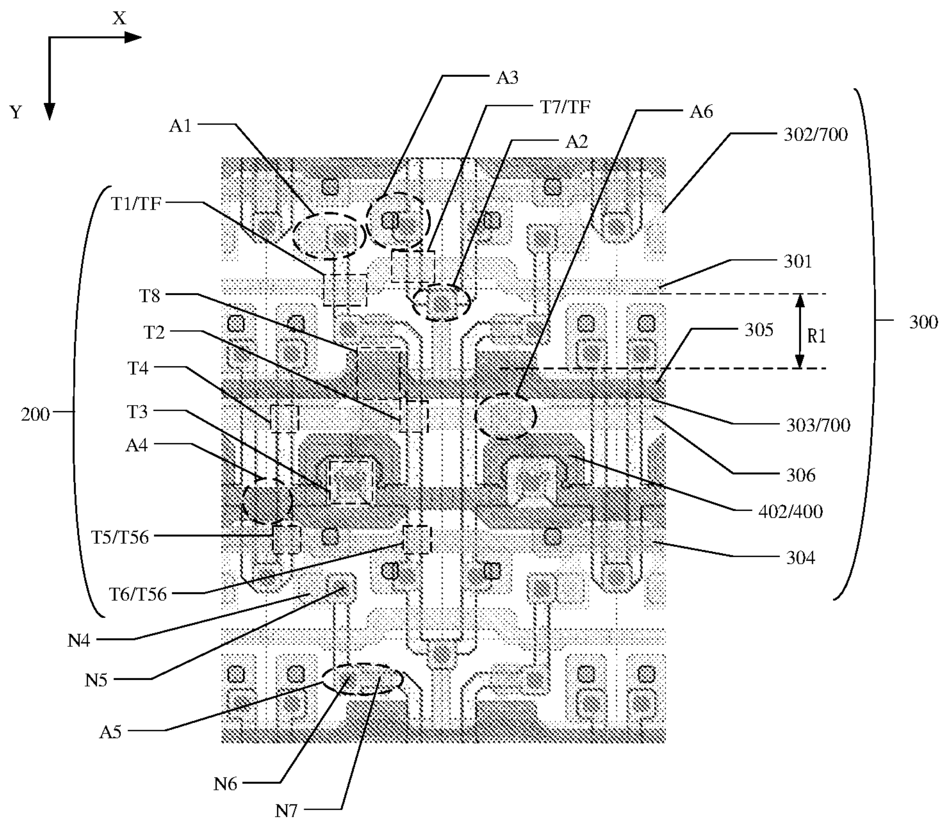
FIG. 2 is a schematic layout diagram of a pixel circuit provided by at least one embodiment of the present disclosure.

FIG. 1A is a schematic diagram of a sub-pixel in a display substrate provided by at least one embodiment of the present disclosure; FIG. 1B is a schematic circuit diagram of a sub-pixel in a display substrate provided by at least one embodiment of the present disclosure; FIG. 2 is a schematic layout diagram of a pixel circuit provided by at least one embodiment of the present disclosure.

Referring to FIG. 1A-FIG. 2, at least one embodiment of the present disclosure provides a display substrate, including a base substrate, a plurality of sub-pixels 100, and a plurality of signal lines 300. The plurality of sub-pixels 100 are located on the base substrate, the sub-pixel 100 includes a light-emitting element 100*b* and a pixel circuit 100*a*, the pixel circuit 100*a* is configured to drive the light-emitting element 100*b*, the pixel circuit 100*a* includes a plurality of transistors 200 and a storage capacitor 400, each transistor 200 includes a gate electrode, a first electrode, and a second electrode.

For example, one of the first electrode and the second electrode of the transistor 200 may be a source electrode, and the other of the first electrode and the second electrode of the transistor 200 may be a drain electrode, and in the transistor, the source electrode and the drain electrode are relatively interchangeable.

Referring to FIG. 1A-FIG. 2, the plurality of signal lines 300 are arranged on the base substrate, and include a first initialization signal line 302, a reset control signal line 301, and a second initialization signal line 303 which extend in a first direction X and are arranged in a second direction Y, the reset control signal line 301 is configured to supply a reset control signal to the pixel circuit 100*a*, the first initialization signal line 302 is configured to supply a first initialization signal to the pixel circuit 100*a*, and the second initialization signal line 303 is configured to supply a second initialization signal to the pixel circuit 100*a*, and the second direction Y intersects with the first direction X.

Referring to FIG. 1A-FIG. 2, the plurality of transistors 200 include a first reset transistor T1 and a second reset transistor T7, a first electrode of the first reset transistor T1 is electrically connected with the first initialization signal line 302, and a gate electrode of the first reset transistor T1 and a gate electrode of the second reset transistor T7 are electrically connected with the reset control signal line 301, a first electrode of the second reset transistor T7 is electrically connected with the second initialization signal line 303, and a second electrode of the second reset transistor T7 is electrically connected with the light-emitting element 100*b*, an orthographic projection of at least one of the first initialization signal line 302 and the second initialization signal line 303 on the base substrate does not overlap with an orthographic projection of the reset control signal line 301 on the base substrate.

In the display substrate provided by the embodiments of the present disclosure, a structure of the pixel circuit 100*a* is optimized based on the LTPO technology, by reducing a signal line whose orthographic projection on the base substrate overlapping with an orthographic projection of the reset control signal line 301 on the base substrate, the load on the reset control signal line 301 can be reduced without adding more processes, which is helpful for alleviating the display defects (for example, Mura) under the low grayscale, improving brightness uniform of a high frequency driving, and improving display quality; at the same time, this scheme makes a layout of the pixel circuit 100*a* is more reasonable and easy to implement.

The embodiments of the present disclosure are described by taking that the orthographic projections of the first initialization signal line 302 and the second initialization signal line 303 on the base substrate do not overlap with the orthographic projection of the reset control signal line 301 on the base substrate as an example. Of course, it is further possible to make that the orthographic projection of one of the first initialization signal line 302 and the second initialization signal line 303 on the base substrate dose not overlap with the orthographic projection of the reset control signal line 301 on the base substrate. Of course, in a case where only one reset transistor is provided, an orthographic projection of an initialization signal line connected with the only one reset transistor on the base substrate does not overlap with the orthographic projection of the reset control signal line 301 on the base substrate.

For example, in some embodiments of the present disclosure, the display substrate may be an organic light-emitting diode (OLED) display substrate, a quantum dot light-emitting diode (QLED) display substrate, an electronic paper display substrate, and so on, which is not limited in the embodiments of the present disclosure.

For example, the base substrate may be a flexible substrate or a rigid substrate. The base substrate may adopt, for example, glass, plastic, quartz, or other suitable materials, which is not limited in the embodiments of the present disclosure.

As illustrated in FIG. 1A, the display substrate includes a sub-pixel 100, and the sub-pixel 100 is located on the base substrate. The sub-pixel 100 includes a pixel circuit 100*a* and a light-emitting element 100*b*, and the pixel circuit 100*a* is configured to drive the light-emitting element 100*b*. For example, the pixel circuit 100*a* is configured to supply a driving current to drive the light-emitting element 100*b* to emit light. For example, the light-emitting element 100*b* is an organic light-emitting diode (OLED), and the light-emitting element 100*b* emits red light, green light, blue light, or white light under the driving of its corresponding pixel circuit 100*a*. A color of light emitted by the light-emitting element 100*b* can be determined according to needs.

As illustrated in FIG. 1B, the sub-pixel 100 includes the pixel circuit 100*a* and a light-emitting element 100*b*. For example, as illustrated in FIG. 1A, the pixel circuit 100*a* includes a plurality of transistors and a storage capacitor 400. The plurality of transistors include: a first reset transistor T1, a second reset transistor T7, a refresh control transistor T8, a driving transistor T3, a data writing transistor T4, a compensation transistor T2, a first light-emitting control transistor T5, and a second light-emitting control transistor T6.

For example, as illustrated in FIG. 1B, a gate electrode of the driving transistor T3 is electrically connected with a node Nd1, a first electrode of the driving transistor T3 is electrically connected with a node Nd3, and a second electrode of the driving transistor T3 is electrically connected with a node Nd2.

For example, as illustrated in FIG. 1B, a gate electrode of the data writing transistor T4 is configured to receive a scan signal Ga1, and a first electrode of the data writing transistor T4 is electrically connected with the second electrode of the driving transistor T3, that is, the first electrode of the data writing transistor T4 is electrically connected with the node Nd2; a second electrode of the data writing transistor T4 is electrically connected with a data line supplying a data signal Vdata.

For example, as illustrated in FIG. 1B, a first electrode of the storage capacitor 400 is electrically connected with the gate electrode of the driving transistor T3, that is, the first electrode of the storage capacitor 400 is electrically connected with the node Nd1, and a second electrode of the storage capacitor 400 is electrically connected with a voltage terminal VDD. By arranging the storage capacitor 400, a compensation signal obtained based on the data signal Vdata can be stored.

For example, as illustrated in FIG. 1B, the gate electrode of the compensation transistor T2 is configured to receive a compensation control signal Ga2, a second electrode of the compensation transistor T2 is electrically connected with the first electrode of the driving transistor T3, that is, the second electrode of the compensation transistor T2 is electrically connected with the node Nd3, and a first electrode of the compensation transistor T2 is electrically connected with a node Nd4. By arranging the compensation transistor T2, a threshold compensation can be performed on the driving transistor T3 in response to the compensation control signal Ga2. The compensation signal stored by the storage capacitor 400 refers to a signal that has been subjected to the threshold compensation.

For example, as illustrated in FIG. 1B, a gate electrode of the first light-emitting control transistor T5 is configured to receive a light-emitting control signal EM, a first electrode of the first light-emitting control transistor T5 is connected with the voltage terminal VDD, and a second electrode of the first light-emitting control transistor T5 is electrically connected with the second electrode of the driving transistor T3, that is, the second electrode of the first light-emitting control transistor T5 is electrically connected with the node Nd2. The first light-emitting control transistor T5 is configured to be turned on to realize a connection between the driving transistor T3 and the voltage terminal VDD in response to the light-emitting control signal EM or is configured to be turned off to realize a disconnection between the driving transistor T3 and the voltage terminal VDD.

For example, as illustrated in FIG. 1B, a gate electrode of the second light-emitting control transistor T6 is configured to receive the light-emitting control signal EM, a first electrode of the second light-emitting control transistor T6 is electrically connected with the first electrode of the light-emitting element 100*b*, and a second electrode of the second light-emitting control transistor T6 is electrically connected with the first electrode of the driving transistor T3, that is, the second electrode of the second light-emitting control transistor T6 is electrically connected with the node Nd3. The second light-emitting control transistor T6 is configured to be turned on to realize a connection between the driving transistor T3 and the light emitting element 100*b* (for example, the first electrode of the light-emitting element 100*b*) in response to the light-emitting control signal EM or is configured to be turned off to realize a disconnection between the driving transistor T3 and the light emitting element 100*b* (for example, the first electrode of the light-emitting element 100*b*).

It should be noted that a signal used to control the first light-emitting control transistor T5 and a signal used to control the second light-emitting control transistor T6 may be different.

For example, as illustrated in FIG. 1B, a first electrode of the refresh control transistor T8 is electrically connected with the gate electrode of the driving transistor T3, that is, electrically connected with the node Nd1, and a second electrode of the refresh control transistor T8 is electrically connected with the node Nd4, a gate electrode of the control transistor T8 is configured to receive a refresh control signal Ga3.

For example, as illustrated in FIG. 1B, the refresh control transistor T8 is electrically connected with the gate electrode of the driving transistor T3 (for example, the node Nd1) and the node Nd4, respectively, that is, the refresh control transistor T8 is electrically connected with the compensation transistor T2, and the refresh control transistor T8 is configured to be turned on to realize a connection between the gate electrode of the driving transistor T3 (for example, node Nd1) and the compensation transistor T2 in response to the refresh control signal Ga3 or is configured to be turned off to realize a disconnection between the gate electrode of the driving transistor T3 (for example, node Nd1) and the compensation transistor T2. In an example illustrated in FIG. 1B, the refresh control transistor T8 is used to be turned on to realize a connection between the node Nd1 and the node Nd4 in response to the refresh control signal Ga3 or is used to be turned off to realize a disconnection between the node Nd1 and the node Nd4.

It should be noted that a type of an active layer of the refresh control transistor T8 is different from a type of an active layer of at least one of the other transistors in the pixel circuit 100*a*. For example, that is to say, the pixel circuit is a pixel circuit having a plurality of types of transistors. For example, the refresh control transistor T8 is an oxide transistor, for example, in some embodiments, the refresh control transistor T8 may be an Indium Gallium Zinc Oxide (IGZO) thin film transistor. For example, the refresh control transistor T8 may be an N-type transistor.

It should be noted that in the embodiments of the present disclosure, the "type of the active layer" indicates a type of material used to form the active layer, and the material of the active layer may include indium gallium zinc oxide, low-temperature polysilicon, amorphous silicon (such as hydrogenated amorphous silicon), low-temperature polysilicon and oxide, and so on. For example, a type of an active layer of a thin film transistor adopting the indium gallium zinc oxide as an active layer and a type of an active layer of a thin film transistor adopting the low-temperature polysilicon as an active layer are different. In the embodiments of the present disclosure, in a case where the types of the active layers of the transistors are different, the types of the transistors are different.

For example, as illustrated in FIG. 1B, a first electrode of the first reset transistor T1 is electrically connected with a first reset voltage terminal Vinit1, a second electrode of the first reset transistor T1 is electrically connected with the node Nd4, and a gate electrode of the first reset transistor T1 is configured to receive a first reset control signal Re.

For example, as illustrated in FIG. 1B, the first reset transistor T1 is electrically connected with the refresh control transistor T8 and the first reset voltage terminal Vinit1, respectively, and the first reset transistor T1 is configured to reset the gate electrode of the driving transistor T3 and the first electrode of the storage capacitor 400 (that is, the node Nd1) through the refresh control transistor T8 in response to the first reset control signal Re. For example, the first reset transistor T1 may write the first reset voltage supplied by the first reset voltage terminal Vinit1 into the gate electrode of the driving transistor T3 and the first electrode of the storage capacitor 400 (that is, the node Nd1) through the refresh control transistor T8, so as to reset the gate electrode of the driving transistor T3 and the first electrode of the storage capacitor 400.

For example, as illustrated in FIG. 1B, the first electrode of the second reset transistor T7 is electrically connected with the second reset voltage terminal Vinit2, and the second electrode of the second reset transistor T7 is electrically connected with the first electrode of the light-emitting element 100*b*. The gate electrode of the second reset transistor T7 is configured to receive a second reset control signal Rst.

For example, a voltage value of a second reset voltage at the second reset voltage terminal Vinit2 is greater than a voltage value of a first reset voltage at the first reset voltage terminal Vinit1, by increasing the second reset voltage at the second reset voltage terminal Vinit2, and resetting carrier inside the light-emitting element 100*b*, carrier defects are reduced, device stability is increased, and a problem of screen flicker is further alleviated. However, the present disclosure is not limited to this, and the voltage value of the second reset voltage at the second reset voltage terminal Vinit2 may be equal to the voltage value of the first reset voltage at the first reset voltage terminal Vinit1.

For example, as illustrated in FIG. 1B, the second reset transistor T7 is electrically connected with the first electrode of the light-emitting element 100*b* and the second reset voltage terminal Vinit2, respectively, and is configured to rest first electrode of the light-emitting element 100*b* in response to the second reset control signal Rst. For example, the second reset transistor T7 can write the second reset voltage supplied by the second reset voltage terminal Vinit2 into the first electrode of the light-emitting element 100*b*, so as to reset the first electrode of the light-emitting element 100*b*.

For example, the first reset transistor T1, the compensation transistor T2, the driving transistor T3, the data writing transistor T4, the first light-emitting control transistor T5, the second light-emitting control transistor T6, and the second reset transistor T7 are all polysilicon thin film transistors, for example, the low temperature polysilicon (LTPS) thin film transistor, the present disclosure is not limited to this, at least part of the first reset transistor T1, the compensation transistor T2, the driving transistor T3, the data writing transistor T4, the first light-emitting control transistor T5, the second light-emitting control transistor T6, the second reset transistor T7 may be oxide transistors.

For example, the first reset transistor T1, the compensation transistor T2, the driving transistor T3, the data writing transistor T4, the first light-emitting control transistor T5, the second light-emitting control transistor T6, and the second reset transistor T7 may all be P-type transistors, or at least part of them is N-type transistor, which is not limited in the embodiments of the present disclosure.

The embodiments of the present disclosure are described by taking that the first reset transistor T1, the compensation transistor T2, the driving transistor T3, the data writing transistor T4, the first light-emitting control transistor T5, the second light-emitting control transistor T6, and the second reset transistor T7 are all the P-type transistors, and the refresh control transistor T8 is an N-type transistor as an example.

For example, the light-emitting element 100*b* may be a light-emitting diode or the like. The light-emitting diode may be a micro light-emitting diode (Micro LED), an organic light-emitting diode (OLED), or a quantum dot light-emitting diode (QLED). The light-emitting element 100*b* is configured to receive a light-emitting signal (for example, may be a driving current) during operation, and emit light with an intensity corresponding to the light-emitting signal. For example, the light-emitting element 100*b* may include a first electrode, a light-emitting functional layer, and a second electrode. The first electrode of the light-emitting element 100*b* may be an anode, and the second electrode of the light-emitting diode may be a cathode. It should be noted that, in the embodiments of the present disclosure, the light-emitting functional layer of the light-emitting element 100*b* may include an electroluminescent layer itself and common layers located on both sides of the electroluminescent layer, for example, the common layer may include a hole injection layer, a hole transport layer, an electron injection layer, and an electron transport layer, and so on. In practical applications, a specific structure of the light-emitting element 100*b* can be designed and determined according to actual application environment, which is not limited here. For example, the light-emitting element 100*b* has a light-emitting threshold voltage, and the light-emitting element 100*b* emits light in a case where a voltage between the first electrode and the second electrode of the light-emitting element 100*b* is greater than or equal to the light-emitting threshold voltage.

For example, as illustrated in FIG. 1B, the second electrode of the light-emitting element 100*b* is electrically connected with a voltage terminal VSS.

For example, one of a voltage output from the voltage terminal VDD and a voltage output from the voltage terminal VSS is a high voltage, and the other of the voltage output from the voltage terminal VDD and the voltage output from the voltage terminal VSS is a low voltage. For example, in an embodiment illustrated in FIG. 1B, the voltage output from the voltage terminal VDD is a constant positive voltage; and the voltage output from the voltage terminal VSS is a constant negative voltage. For example, in some examples, the voltage terminal VSS may be grounded. VDD refers to a voltage terminal and a voltage signal supplied by the voltage terminal, and VSS refers to a voltage terminal and a voltage signal supplied by the voltage terminal.

For example, the display panel is usually in situation where an image switching frequency for switching picture display and web browsing is low, for example, in this case, the switching frequency of content displayed on the display panel (that is, a screen refresh frequency of the display panel) can be 1 hertz (Hz), 5 Gz, and the like, in this case, the pixel circuit in the display panel is in a first display mode, for example, a low-frequency display mode. In a case where the display panel displays content, such as a dynamic video, the switching frequency of the content displayed on the display panel is relatively high, for example, in this case, the switching frequency of the content displayed on the display panel can be 50 Hz, 60 Hz, and the like, in this case, the pixel circuit is in a second display mode, for example, a high frequency display mode.

For example, the refresh control transistor T8 is used to control whether the compensation signal obtained based on a data signal can be transmitted to the node Nd1, thereby controlling the display mode of the pixel circuit 100*a*. For example, the refresh control transistor T8 can ensure that the node Nd1 in the pixel circuit 100*a* is not refreshed within a relatively long time (for example, 1 second), thereby controlling the pixel circuit 100*a* to perform a low frequency driving to realize the low frequency display mode.

For example, in some embodiments, the scan signal Ga1, the compensation control signal Ga2, and the second reset control signal Rst can be the same signal, so that the data writing transistor T4, the compensation transistor T2, and the second reset transistor T7 can be connected with the same signal line, so that the number of signal lines is reduced, which is beneficial to a narrow frame design of the display panel and reducing a line arrangement space of the pixel circuit, and improving resolution of the display panel. In addition, the scan signal Ga1, the compensation control signal Ga2, and the second reset control signal Rst can be generated by the same gate electrode driving circuit, thereby reducing the number of gate electrode driving circuits, saving space and reducing cost.

For example, a first reset control signal Re and the scan signal Ga1 can be generated by the same gate electrode drive circuit, and are signals output by two adjacent rows of shift register units in the gate electrode driving circuit, respectively.

As illustrated in FIG. 2, the plurality of signal lines 300 are provided on the base substrate, and the plurality of signal lines 300 include a reset control signal line 301, a first initialization signal line 302, and a second initialization signal line 303 which extend in a first direction X and are arranged in a second direction Y. For example, the reset control signal line 301 is configured to supply the first reset control signal Re to the first reset transistor T1 and the second reset control signal Rst to the second reset transistor T7. For example, the first initialization signal line 302 is configured to supply a first reset voltage to the first reset transistor T1, and the second initialization signal line 303 is configured to supply a second reset voltage to the second reset transistor T7.

As illustrated in FIG. 2, the second direction Y intersects with the first direction X. For example, the second direction Y may be perpendicular to the first direction X.

As illustrated in FIG. 2, a black dotted box illustrates a position of a channel region of each transistor. In the second direction Y, the first electrode of the first reset transistor T1 is closer to the storage capacitor 400 than the second electrode of the first reset transistor T1, and the first reset transistor T1 is electrically connected with the first initialization signal line 302 at a position A1. The gate electrode of the first reset transistor T1 and the gate electrode of the second reset transistor T7 are connected with the same signal line, as illustrated in FIG. 2, both are connected with the reset control signal line 301. The first electrode of the second reset transistor T7 is electrically connected with the second initialization signal line 303 at a position A2, and the second electrode of the second reset transistor T7 is electrically connected with the light-emitting element (not illustrated) at a position A3.

In at least one embodiment of the present disclosure, the orthographic projection of at least one of the first initialization signal line 302 and the second initialization signal line 303 on the base substrate does not overlap with the orthographic projection of the reset control signal line 301 on the base substrate.

For example, as illustrated in FIG. 2, the orthographic projections of the first initialization signal line 302 and the second initialization signal line 303 on the base substrate do not overlap with the orthographic projection of the reset control signal line 301 on the base substrate. For example, in some embodiments of the present disclosure, an orthographic projection of one of the first initialization signal line 302 and the second initialization signal line 303 on the base substrate dose not overlap with the orthographic projection of the reset control signal line 301 on the base substrate, and an orthographic projection of the other one of the first initialization signal line 302 and the second initialization signal line 303 on the base substrate at least partially overlaps with the orthographic projection of the reset control signal line 301 on the base substrate. For example, the orthographic projection of the second initialization signal line 303 on the base substrate does not overlap with the orthographic projection of the reset control signal line 301 on the base substrate, and the orthographic projection of the first initialization signal line 302 on the base substrate at least partially overlap with the orthographic projection of the reset control signal line 301 on the base substrate. For example, an orthographic projection of the first initialization signal line 302 on the base substrate does not overlap with the orthographic projection of the reset control signal line 301 on the base substrate, and the orthographic projection of the second initialization signal line 303 on the base substrate at least partially overlap with the orthographic projection of the reset control signal line 301 on the base substrate. In this regard, the embodiments of the present disclosure do not limit this.

Therefore, by making the orthographic projection of at least one of the first initialization signal line 302 and the second initialization signal line 303 on the base substrate dose not overlap the orthographic projection of the reset control signal line 301 on the base substrate, the load on the reset control signal line can be reduced, which is helpful for alleviating the display defects (for example, Mura) under the low grayscale, improving brightness uniform of high frequency driving, and improving display quality; at the same time, this scheme makes a layout of the pixel circuit is more reasonable and easy to implement without adding more processes.

Figure 3A:
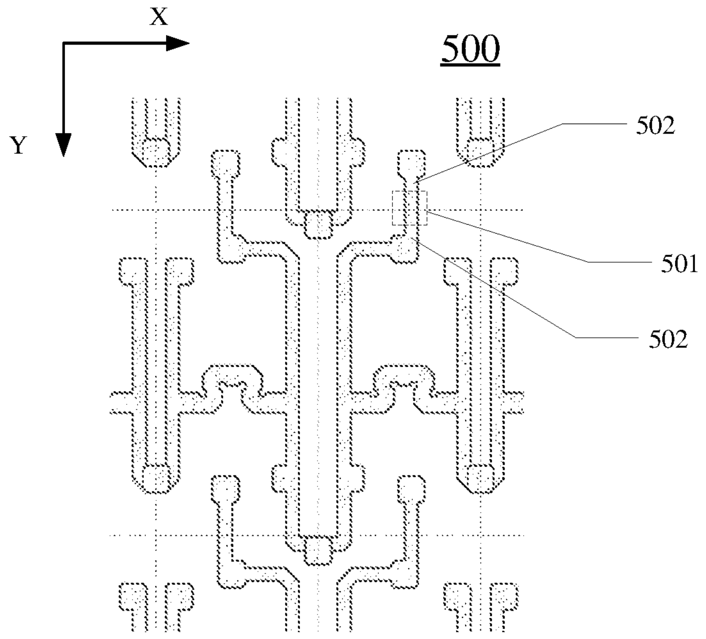
FIG. 3A is a schematic diagram of a first active layer provided by at least one embodiment of the present disclosure.
Figure 3B:
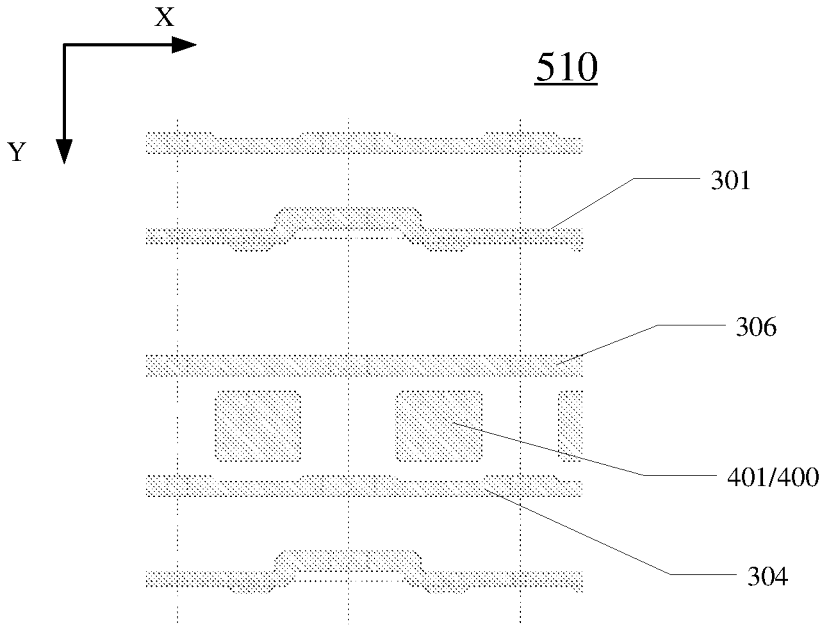
FIG. 3B is a schematic diagram of a first conductive layer provided by at least one embodiment of the present disclosure.
Figure 3C:
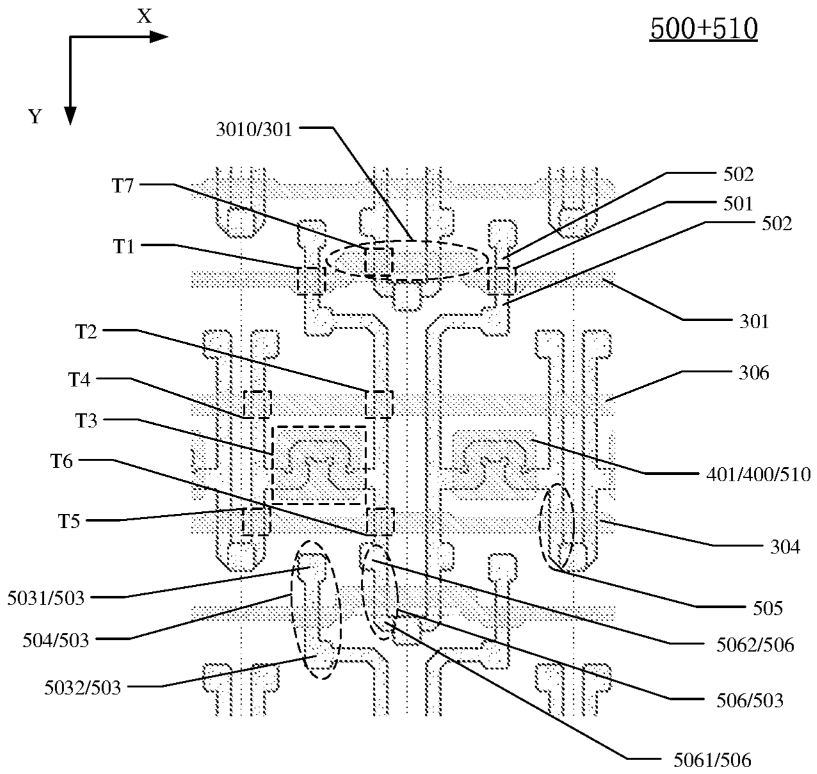
FIG. 3C is a plan view illustrating stacked-layers of a first active layer and a first conductive layer of a display substrate provided by at least one embodiment of the present disclosure.
Figure 4A:
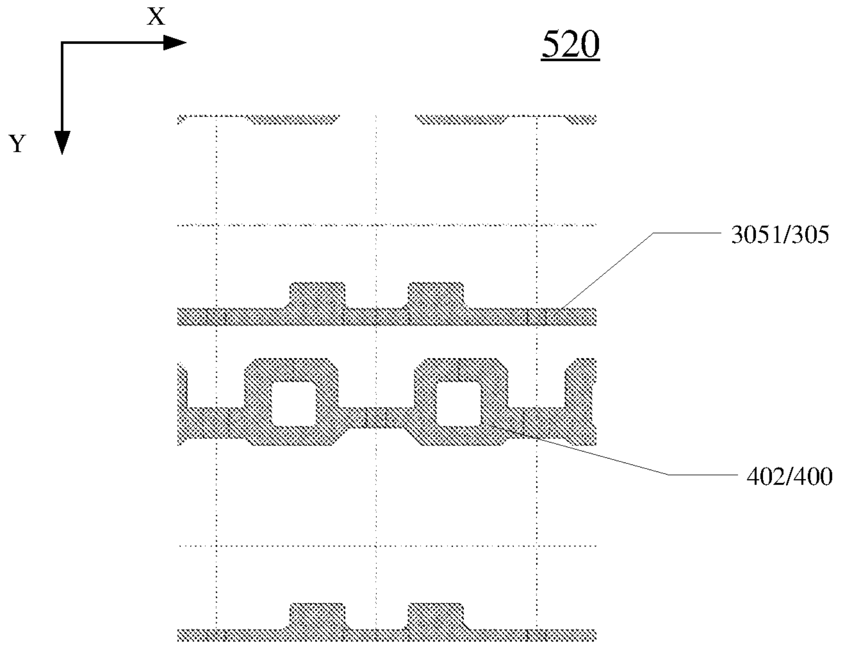
FIG. 4A is a schematic diagram of a second conductive layer provided by at least one embodiment of the present disclosure.
Figure 4B:
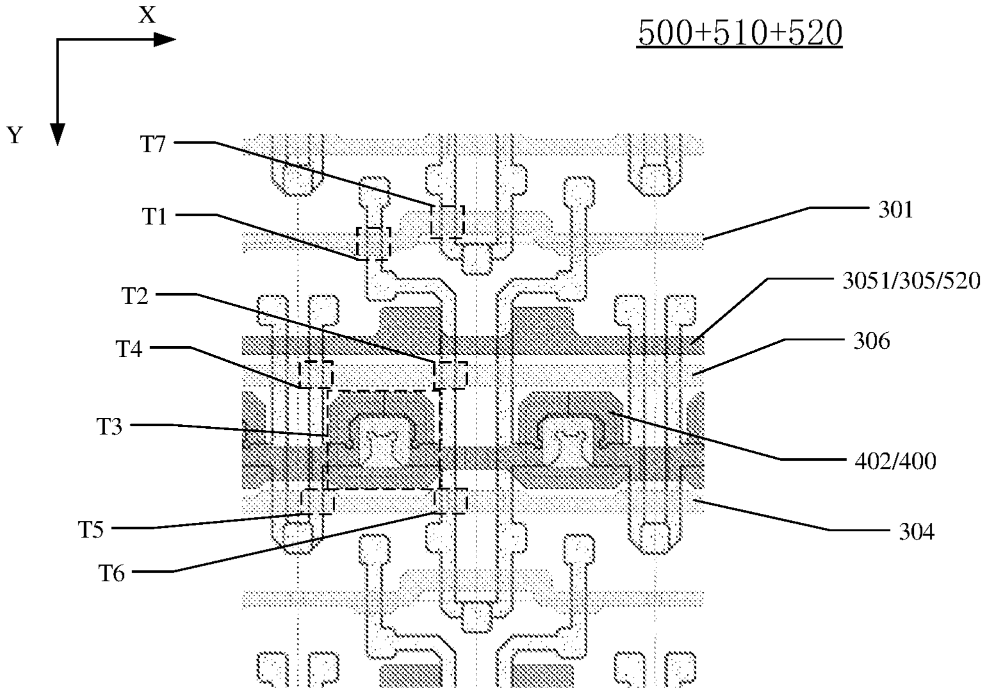
FIG. 4B is a plan view illustrating stacked-layers of a first active layer, a first conductive layer, and a second conductive layer of a display substrate provided by at least one embodiment of the present disclosure.
Figure 5A:
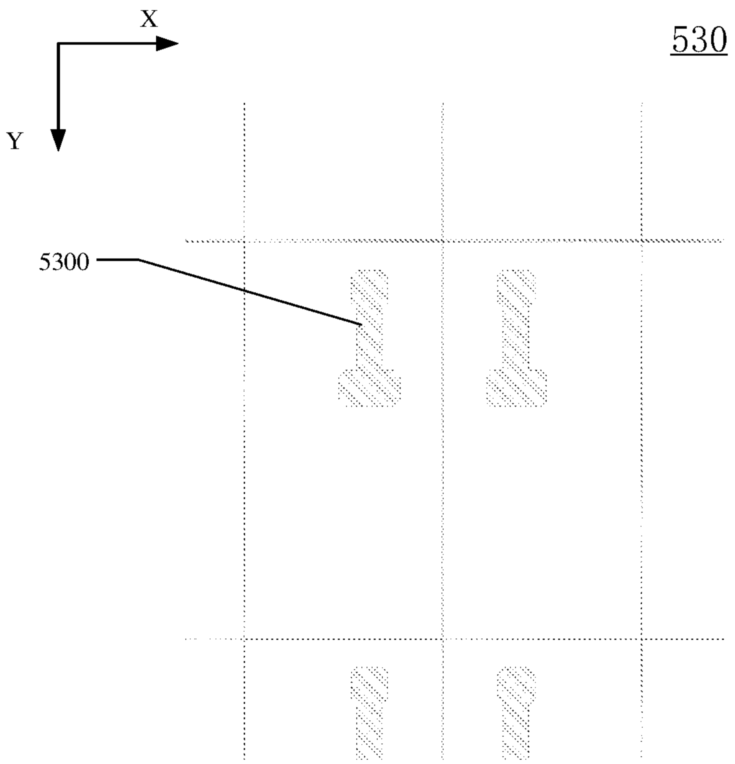
FIG. 5A is a schematic diagram of a second active layer provided by at least one embodiment of the present disclosure.
Figure 5B:
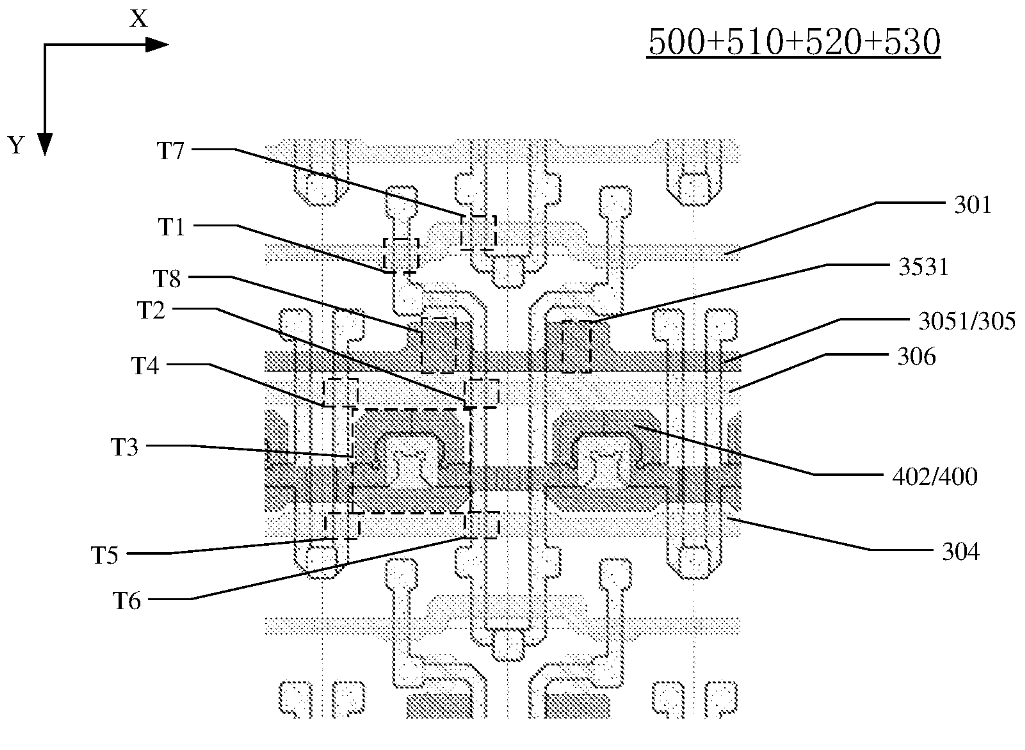
FIG. 5B is a plan view illustrating stacked-layers of a first active layer, a first conductive layer, a second conductive layer, and a second active layer of a display substrate provided by at least one embodiment of the present disclosure.
Figure 6A:
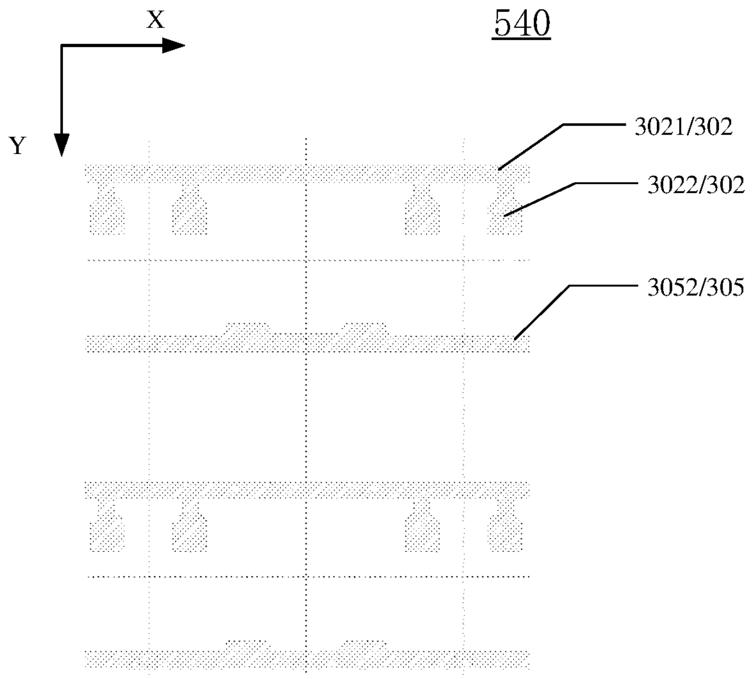
FIG. 6A is a schematic diagram of a third conductive layer provided by at least one embodiment of the present disclosure.
Figure 6B:
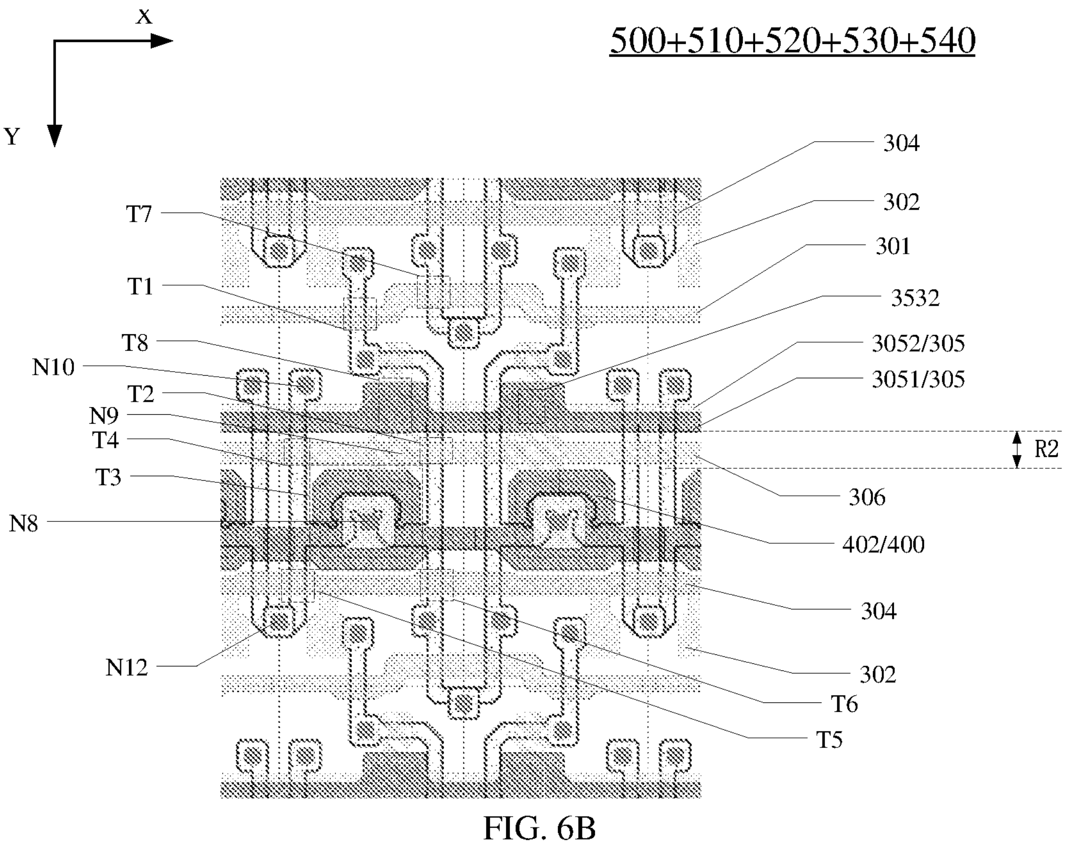
FIG. 6B is a plan view illustrating stacked-layers of a first active layer, a first conductive layer, a second conductive layer, a second active layer, and a third conductive layer of a display substrate provided by at least one embodiment of the present disclosure.
Figure 7:
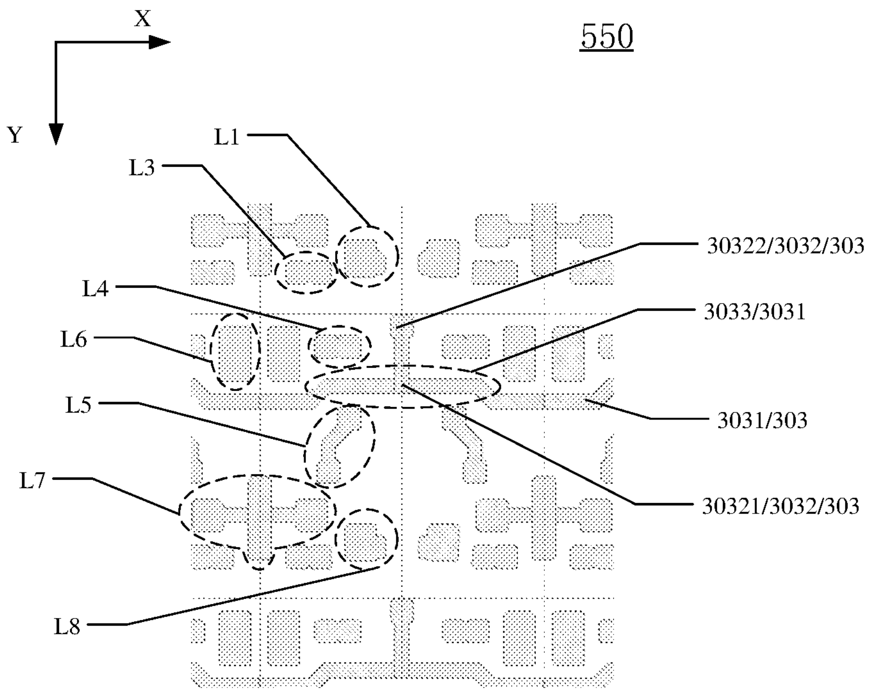
FIG. 7 is a schematic diagram of a first connection layer provided by at least one embodiment of the present disclosure.
Figure 8:
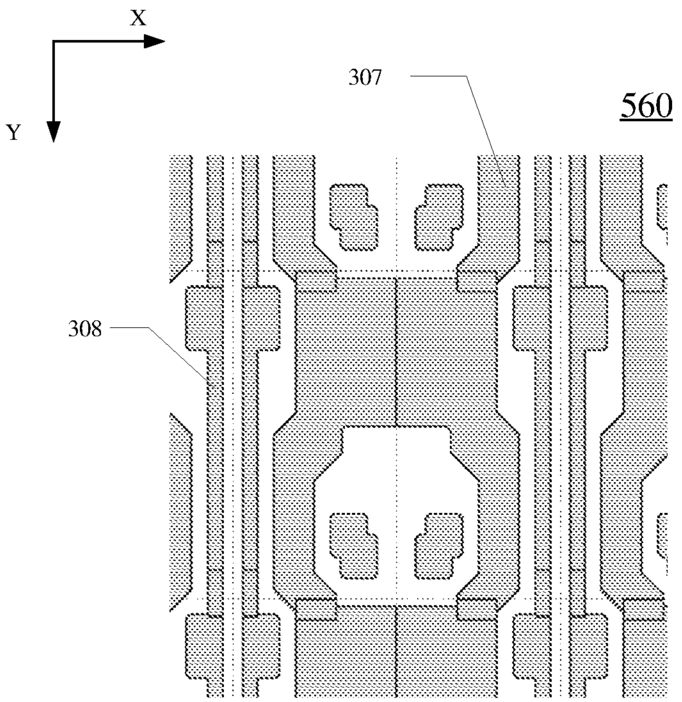
FIG. 8 is a schematic diagram of a second connection layer provided by at least one embodiment of the present disclosure.
Figure 9:
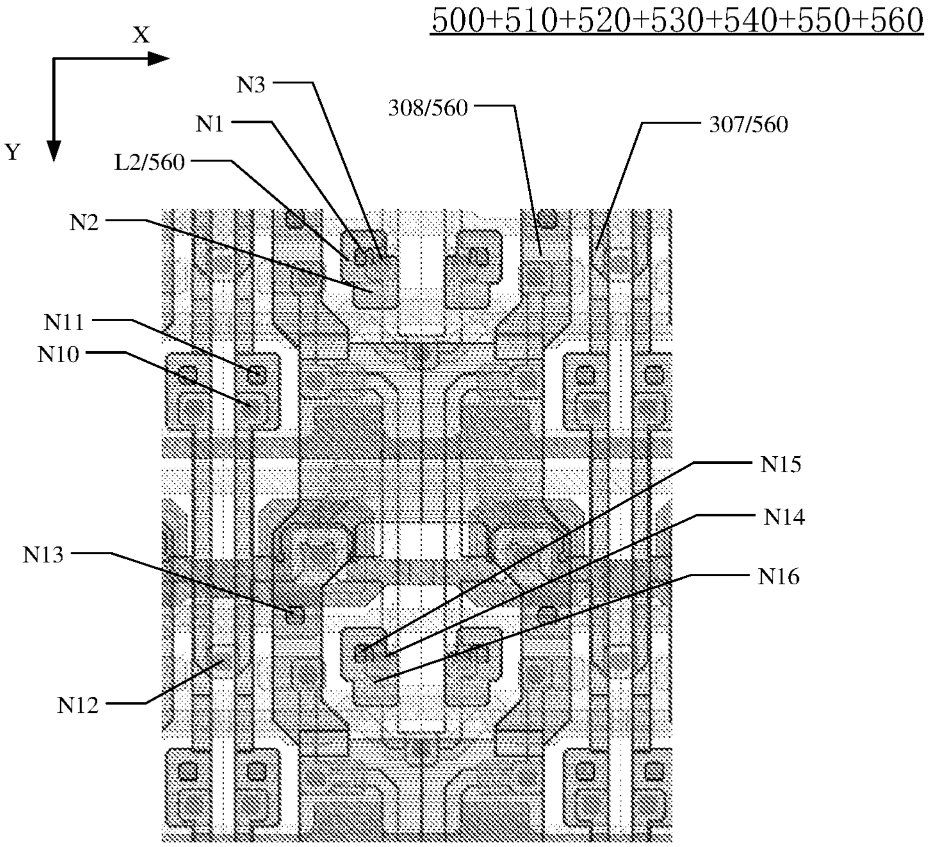
FIG. 9 is a plan view illustrating stacked-layers of a first active layer, a first conductive layer, a second conductive layer, a second active layer, a third conductive layer, a first connection layer, and a second connection layer of a display substrate provided by at least one embodiment of the present disclosure.

FIG. 3A is a schematic diagram of a first active layer provided by at least one embodiment of the present disclosure. FIG. 3B is a schematic diagram of a first conductive layer provided by at least one embodiment of the present disclosure. FIG. 3C is a plan view illustrating stacked-layers of a first active layer and a first conductive layer of a display substrate provided by at least one embodiment of the present disclosure. FIG. 4A is a schematic diagram of a second conductive layer provided by at least one embodiment of the present disclosure. FIG. 4B is a plan view illustrating stacked-layers of a first active layer, a first conductive layer, and a second conductive layer of a display substrate provided by at least one embodiment of the present disclosure. FIG. 5A is a schematic diagram of a second active layer provided by at least one embodiment of the present disclosure. FIG. 5B is a plan view illustrating stacked-layers of a first active layer, a first conductive layer, a second conductive layer, and a second active layer of a display substrate provided by at least one embodiment of the present disclosure. FIG. 6A is a schematic diagram of a third conductive layer provided by at least one embodiment of the present disclosure. FIG. 6B is a plan view illustrating stacked-layers of a first active layer, a first conductive layer, a second conductive layer, a second active layer, and a third conductive layer of a display substrate provided by at least one embodiment of the present disclosure. FIG. 7 is a schematic diagram of a first connection layer provided by at least one embodiment of the present disclosure. FIG. 8 is a schematic diagram of a second connection layer provided by at least one embodiment of the present disclosure. FIG. 9 is a plan view illustrating stacked-layers of a first active layer, a first conductive layer, a second conductive layer, a second active layer, a third conductive layer, a first connection layer, and a second connection layer of a display substrate provided by at least one embodiment of the present disclosure.

For example, in at least one embodiment of the present disclosure, the plurality of transistors 200 include a driving transistor T3, a first light-emitting control transistor T5, and a second light-emitting control transistor T6, and the plurality of signal lines 300 further include a light-emitting control signal line 304, and the light-emitting control signal line 304 extends in the first direction X.

For example, referring to FIG. 1B-FIG. 4B, the first electrode of the first light-emitting control transistor T5 is electrically connected with a second electrode 402 of the storage capacitor, and the first electrode of the second light-emitting control transistor T6 is connected with the second electrode of the second reset transistor T7. The gate electrode of the first light-emitting control transistor T5 and the gate electrode of the second light-emitting control transistor T6 are electrically connected with a light-emitting control signal line 304, and the second electrode of the first light-emitting control transistor T5 and the second electrode of the second light-emitting control transistor T6 is connected with the second electrode of the driving transistor T3 and the first electrode of the driving transistor T3, respectively, and the gate electrode of the driving transistor T3 is connected with a first electrode 401 of the storage capacitor.

For example, referring to FIG. 2 and FIG. 6B, the orthographic projection of the first initialization signal line 302 on the base substrate at least partially overlaps with an orthographic projection of the light-emitting control signal line 304 on the base substrate, so that a load on the reset control signal line 304 is reduced.

In the display substrate provided by the embodiments of the present disclosure, by overlapping the first initialization signal line 302 with the light-emitting control signal line 304, the load is transferred to the light-emitting control signal line 304 that supplies a light-emitting signal EM and is not affected by the load, which significantly reduces the load on the reset control signal line 304, is beneficial to improving the threshold compensation effect of the driving transistor, improving display brightness uniformity, and improving the display effect.

For example, referring to FIG. 3C-FIG. 6B, the display substrate includes a first active layer 500 and a first conductive layer 510, and the first active layer 500 is arranged on a side of the first conductive layer 510 close to the base substrate. For example, the display substrate includes the light-emitting control signal line 304, which is arranged on a side of the first active layer 500 away from the base substrate, and the orthographic projection of the light-emitting control signal line 304 on the base substrate at least partially overlaps with an orthographic projection of an active pattern of the first active layer 500 on the base substrate, and portions of the light-emitting control signal line 304 that overlap with the first active layer 500 serve as the gate electrode of the first light-emitting control transistor T5 and the gate electrode of the second light-emitting control transistor T6, respectively; that is, the gate electrode of the first light-emitting control transistor T5 and the gate electrode of the second light-emitting control transistor T6 are electrically connected with the light-emitting control signal line 304, respectively. For example, as illustrated in FIG. 3B, the embodiments of the present disclosure are described by taking that the light-emitting control signal line 304 is arranged in the first conductive layer 510 as an example. Of course, in some embodiments of the present disclosure, the light-emitting control signal line 304 may further be arranged in other conductive layers, which is not limited thereto.

As illustrated in FIG. 3C, the second electrode of the first light-emitting control transistor T5 and the second electrode of the driving transistor T3 are connected with each other and are integrally formed. The second electrode of the second light-emitting control transistor T6, the first electrode of the driving transistor T3, and the second electrode of the compensation transistor T2 are connected with each other and are integrally formed. The first electrode of the second light-emitting control transistor T6 and the second electrode of the second reset transistor T7 are electrically connected with each other and are integrally formed.

Referring to FIG. 3C-FIG. 4B, the first electrode 401 of the storage capacitor is arranged on the side of the first active layer 500 away from the base substrate, and at least partially overlaps with the active pattern in the first active layer 500; the second electrode 402 of the storage capacitor is arranged on a side of the first electrode 401 of the storage capacitor away from the base substrate. For example, the second electrode 402 of the storage capacitor can be arranged opposite to the first electrode 401 of the storage capacitor to form the storage capacitor 400.

Referring to FIG. 7-FIG. 9, the first connection layer 550 and the second connection layer 560 include a plurality of connection electrodes such as a connection electrode L1, a connection electrode L2, a connection electrode L3, a connection electrode L4, a connection electrode L5, a connection electrode L6, a connection electrode L7, and a connection electrode L8, the plurality of connection electrodes are configured to electrically connect structures in the pixel circuit. For example, in some embodiments of the present disclosure, the plurality of connection electrodes may be located in the same layer, or in different layers.

Referring to FIG. 2, FIG. 3C and FIG. 7, the first electrode of the first light-emitting control transistor T5 is electrically connected with the second electrode 402 of the storage capacitor through the connection electrode L7 through a via hole at a position A4. By arranging the connection electrode L7, the first electrode of the first light-emitting control transistor T5 and the second electrode 402 of the storage capacitor that are far apart can be connected with each other without adding more processes, which is beneficial to the layout design.

Referring to FIG. 2, FIG. 4B-FIG. 6B, the orthographic projection of the first initialization signal line 302 on the base substrate at least partially overlaps with the orthographic projection of the light-emitting control signal line 304 on the base substrate. Moreover, a region of the orthographic projection of the first initialization signal line 302 on the base substrate covers a region of the orthographic projection of the light-emitting control signal line 304 on the base substrate as much as possible. As illustrated in FIG. 6B, an orthographic projection of a portion of the first initialization signal line 302 extending in the first direction X on the base substrate substantially completely coincides with the orthographic projection of the light-emitting control signal line 304 on the base substrate. During a driving process of the pixel circuit, the load on the light-emitting control signal line 304 increases, which will increase rise time and fall time when the light-emitting control signal switches between a high level and a low level, while because the light-emitting control signal line 304 maintains a high level state for a long time, which is much longer than and includes a time period when the reset control signal line 301 is at a low level, and therefore, by arranging the first initialization signal line 302 on a side of the light-emitting control signal line 304 away from the base substrate, an increase of the load on the light-emitting control signal line 304 has little effect on a driving control of the pixel circuit.

Therefore, the orthographic projection of the first initialization signal line 302 on the base substrate at least partially overlaps with the orthographic projection of the light-emitting control signal line 304 on the base substrate, which is beneficial to reducing the load on the reset control signal line 301, and at the same time has less effect on the driving control of the pixel circuit, and makes the line arrangement space in the display panel reasonable, the space is suitable, and is easy to implement.

For example, referring to FIG. 1B, FIG. 2 and FIG. 4B-FIG. 6B, the plurality of transistors 200 include the refresh control transistor T8, the first electrode of the refresh control transistor T8 is electrically connected with the first electrode 401 of the storage capacitor, and the second electrode of the refresh control transistor T8 is electrically connected with the second electrode of the first reset transistor T1. The plurality of signal lines 300 further include a refresh gate line 305, the refresh gate line 305 extends in the first direction X, and the gate electrode of the refresh control transistor T8 is electrically connected with the refresh gate line 305, and the orthographic projection of the second initialization signal line 303 on the base substrate at least partially overlaps with an orthographic projection of the refresh gate line 305 on the base substrate, so as to reduce the load on the reset control signal line 304.

In the display substrate provided by the embodiments of the present disclosure, by overlapping the second initialization signal line 303 with the refresh gate line 305, the load on the second initialization signal line 303 is transferred to the refresh gate line 305 which supplies a gate signal Gate N and is not affected by the load, the load on the reset control signal line 304 is greatly reduced, which is conducive to improving the threshold compensation effect of the driving transistor, improving the display brightness uniformity, and improving the display effect.

Referring to FIG. 1B, FIG. 2 and FIG. 4B-6B, the refresh control transistor T8 may be an oxide transistor, a gate line of the refresh transistor T8 is the refresh gate line 305, and the gate electrode of the refresh control transistor T8 is electrically connected with the refresh gate line 305. The first electrode of the refresh control transistor T8 is located on a side of the refresh control transistor T8 close to the first reset transistor T1, and the second electrode of the refresh control transistor T8 is located on a side of the refresh control transistor T8 away from the first reset transistor T1. The first electrode of the refresh control transistor T8 is electrically connected with the first electrode 401 of the storage capacitor through the connection electrode L5 at a position A6, and the second electrode of the refresh control transistor T8 is electrically connected with the second electrode of the first reset transistor T1 through the connection electrode L4 at a position A5. It can be seen from FIG. 2 that the first electrode of the refresh control transistor T8 is far away from the first electrode 401 of the storage capacitor, by arranging the connection electrode L5, an electrical connection between the first electrode of the refresh control transistor T8 and the first electrode 401 of the storage capacitor can be realized without adding more processes, which is beneficial to the layout design.

Similar to the light-emitting control signal line 304, an increase of the load on the refresh gate line 305 has little effect on the driving control of the pixel circuit 100*a*, by arranging the compensation transistor T2 on a side of the refresh gate line 305 of the refresh control transistor T8 away from the reset control signal line 301, the load on the reset control signal line 301 can be greatly reduced, which is beneficial to a control of a driving signal in the pixel circuit and the layout design.

For example, as illustrated in FIG. 2, the first initialization signal line 302 and the second initialization signal line 303 are arranged at intervals in the second direction Y.

As illustrated in FIG. 2, the orthographic projection of the first initialization signal line 302 on the base substrate and the orthographic projection of the second initialization signal line 303 on the base substrate both do not overlap with the orthographic projection of the reset control signal line 301 on the base substrate. The orthographic projection of the first initialization signal line 302 on the base substrate at least partially overlaps with the orthographic projection of the light-emitting control signal line 304 on the base substrate, and the orthographic projection of the second initialization signal line 303 on the base substrate at least partially overlaps with the orthographic projection of the refresh gate line 305 on the base substrate. In the second direction Y, the storage capacitor 400 is further provided between the refresh gate line 305 and the nearest light-emitting control signal line 304, so that the first initialization signal line 302 and the second initialization signal line 303 have a larger interval spacing in the second direction Y.

Therefore, signal crosstalk between the first initialization signal line 302 and the second initialization signal line 303 and interference to other signal lines in the pixel circuit can be reduced.

For example, as illustrated in FIG. 2, the orthographic projection of the reset control signal line 301 on the base substrate does not overlap with an orthographic projection of a signal line of the plurality of signal lines 300 extending in the first direction X on the base substrate.

As illustrated in FIG. 2, the reset control signal line 301 extends in the first direction X, and the orthographic projection of the reset control signal line 301 on the base substrate dose not overlap with the orthographic projection of a signal line of the plurality of signal lines 300 extending in the first direction X on the base substrate. For example, in the second direction Y, the first initialization signal line 302 and the second initialization signal line 303 are arranged on both sides of the reset control signal line 301, respectively, and have larger interval spacings with the reset control signal line 301, respectively. Arranged in this manner, the plurality of signal lines 300 in the display panel have less influence on the reset control signal line 301, and in this case, the load on the reset control signal line 301 is small, which is beneficial to the driving control of a corresponding pixel circuit.

It should be noted that a structure of the pixel circuit illustrated in FIG. 2 is only an example, not a limitation. For example, in some embodiments of the present disclosure, according to an actual layout design requirement, the orthographic projection of the reset control signal line 301 on the base substrate can at least partially overlap with an orthographic projection of some signal lines that have little effect on the load of the reset control signal line 301 on the base substrate. Moreover, the embodiments of the present disclosure do not limit a size of an overlap area.

For example, referring to FIG. 1B, FIG. 2 and FIG. 3C, the plurality of signal lines 300 further include a scan control signal line 306, and the scan control signal line 306 extends in the first direction X.

For example, as illustrated in FIG. 3C, the plurality of transistors 200 further include the compensation transistor T2 and the data writing transistor T4, and the scan control signal line 306 is electrically connected with the gate electrode of the compensation transistor T2 and the gate electrode of the data writing transistor T4, respectively.

For example, as illustrated in FIG. 2, in the second direction Y, the reset control signal line 301, the refresh gate line 305, and the scan control signal line 306 are arranged sequentially, and the orthographic projection of the second initialization signal line 303 on the base substrate do not overlap with an orthographic projection of the scan control signal line 306 on the base substrate.

As illustrated in FIG. 3C, the scan control signal line 306 is arranged on the side of the first active layer 500 away from the base substrate, and the scan control signal line 306 at least partially overlaps with the active pattern in the first active layer 500. Portions of the scan control signal line 306 whose orthographic projection on the base substrate overlaps with the orthographic projection of the active pattern in the first active layer 500 on the base substrate serve as the gate electrode of the compensation transistor T2 and the gate electrode of the data writing transistor T4, that is, the gate electrode of the compensation transistor T2 and the gate electrode of the data writing transistor T4 are electrically connected with the scan control signal line 306, respectively.

For example, as illustrated in FIG. 2, in the second direction Y, the scan control signal line 306 is arranged between the refresh gate line 305 and the storage capacitor 400, and the orthographic projection of the scan control signal line 306 on the base substrate dose not overlaps with the orthographic projection of the refresh gate line 305 on the base substrate and dose not overlaps with the orthographic projection of the storage capacitor 400 on the base substrate. The reset control signal line 301 is arranged on the side of the refresh gate line 305 away from the scan control signal line 306, and a distance between the scan control signal line 306 and the refresh gate line 305 in the second direction Y is smaller than a distance between the scan control signal line 306 and the reset control signal line 301 in the second direction Y.

As illustrated in FIG. 2, the orthographic projection of the second initialization signal line 303 on the base substrate at least partially overlaps with the orthographic projection of the refresh gate line 305 on the base substrate, and the orthographic projection of the second initialization signal line 303 on the base substrate dose not overlap with the orthographic projection of the scan control signal line 306 on the base substrate; therefore, mutual influence between the second initialization signal line 303 and the scan control signal line 306 can be reduced, and a probability of signal crosstalk can be reduced, so as to facilitate the control of the driving signal in the pixel circuit.

For example, referring to FIG. 2 and FIG. 6B, in the second direction Y, the first initialization signal line 302, the reset control signal line 301, the second initialization signal line 303, the scan control signal line 306, and the storage capacitor 400 are sequentially arranged at intervals, and the minimum spacing R1 between the reset control signal line 301 and the second initialization signal line 303 is greater than the minimum spacing R2 between the refresh gate line 305 and the storage capacitor 400.

Referring to FIG. 2 and FIG. 6B, the orthographic projection of the first initialization signal line 302 on the base substrate, the orthographic projection of the reset control signal line 301 on the base substrate, the orthographic projection of the second initialization signal line 303 on the base substrate, the orthographic projection of the scan control signal line 306 on the base substrate, and the orthographic projection of the storage capacitor 400 on the base substrate do not overlap with each other, and the above-mentioned signal lines are arranged at intervals in the second direction Y, and keep a certain distance. As illustrated in FIG. 2, the minimum spacing between the reset control signal line 301 and the second initialization signal line 303 is R1, the minimum spacing between the refresh gate line 305 and the storage capacitor 400 is R2, and R1 is greater than R2.

In the second direction Y, by making the minimum spacing R1 between the reset control signal line 301 and the second initialization signal line 303 greater than the minimum spacing R2 between the refresh gate line 305 and the storage capacitor 400, the second initialization signal line 303 can be arranged at a position far from the reset control signal line 301, so that signal influence of the second initialization signal line 303 on the reset control signal line 301 can be reduced while reducing the load on the reset control signal line 301, which is beneficial to controlling the drive signal in the pixel circuit.

For example, referring to FIG. 6A-FIG. 6B, the first initialization signal line 302 includes a first body portion 3021 and at least one first connection portion 3022, the first body portion 3021 extends in the first direction X, and an orthographic projection of the first body portion 3021 on the base substrate at least partially overlaps with the orthographic projection of the light-emitting control signal line 304 on the base substrate, and at least one first connection portion 3022 is connected with the first body portion 3021.

For example, referring to FIG. 6A-FIG. 6B, in the second direction Y, an orthographic projection of at least one first connection portion 3022 on the base substrate is located between the orthographic projection of the light-emitting control signal line 304 on the base substrate and the orthographic projection of the reset control signal line 301 on the base substrate.

Referring to FIG. 6A-FIG. 6B, an extension direction of the first body portion 3021 of the first initialization signal line 302 is the same as an extension direction of the light-emitting control signal line 304. A size of the first body portion 3021 in the second direction Y is uniform, and is substantially equivalent to a size of the light-emitting control signal line 304 in the second direction Y. Therefore, as illustrated in FIG. 6B, the orthographic projection of the first body portion 3021 on the base substrate substantially coincides with the orthographic projection of the light-emitting control signal line 304 on the base substrate, so that the first body portion 3021 can occupy as little layout space as possible in the second direction, and the layout design can be more suitable.

For example, referring to FIG. 2, FIG. 6A-FIG. 7, in the second direction Y, the light-emitting control signal line 304 and the reset control signal line 301 are located on both sides of at least one first connection portion 3022, respectively. The first connection layer 550 includes a connection electrode L3, and at least one connection portion 3022 is arranged on a side of the first body portion 3021 close to the first reset transistor T1, such arrangement is beneficial to realizing electrical connection between at least one connection portion 3022 of the first initialization signal line 302 and the first electrode of the first reset transistor T1 through the connection electrode L3 at the position A1, which is beneficial to the layout design.

For example, referring to FIG. 2 and FIG. 3C, the pixel circuit 100*a* includes an active pattern, the active pattern includes a channel region 501 and a source and drain region 502 of each transistor, the active pattern includes a plurality of active portions 503, and each active portion 503 includes a first end 5031 and a second end 5032 located on two sides of the channel region 501.

For example, the active pattern illustrated in FIG. 3C can be formed by patterning a semiconductor material. The active pattern can be used to form channel regions for the above-mentioned first reset transistor T1, compensation transistor T2, driving transistor T3, data writing transistor T4, first light-emitting control transistor T5, second light-emitting control transistor T6, and second reset transistor T7. The active pattern includes an active region pattern (channel region, semiconductor) and a doped region pattern (source and drain region, conductor region) of the above-mentioned transistor of each sub-pixel, and the active region pattern and the doped region pattern of the above-mentioned transistor in the same pixel circuit are integrally arranged.

For example, the active pattern illustrated in FIG. 3C can be made by adopting materials such as amorphous silicon, polysilicon, oxide semiconductor, and the like.

For example, as illustrated in FIG. 3C, each active portion 503 is a part of an active pattern and is integrally formed with the active pattern. For example, the first end 5031 and the second end 5032 of the active portion 503 correspond to the source and drain region of the transistor, and a portion between the first end 5031 and the second end 5032 corresponds to the channel region of the transistor.

For example, referring to FIG. 3C-FIG. 6B, the plurality of active portions 503 include a first active portion 504, the first active portion 504 extends in the second direction Y, and the first end of the first active portion 504 serves as the first electrode of the first reset transistor T1, the second end of the first active portion 504 serves as the second electrode of the first reset transistor T1, and an orthographic projection of the first active portion 504 on the base substrate does not overlap with an orthographic projection of the first body portion 3021 of the first initialization signal line 302 on the base substrate.

Referring to FIG. 3C-FIG. 6B, the first reset signal line 301 is arranged on a side of the first active portion 504 away from the base substrate, and a part of the first reset signal line 301 overlapping with the first active portion 504 serves as the gate electrode of the first reset transistor T1. A part of the first active portion 504 overlapping with the first reset signal line 301 serves as the channel region of the first reset transistor T1, and parts located on both sides of the channel region of the first reset transistor T1 serve as the source and drain region of the first reset transistor T1, that is, serve as the first electrode and the second electrode of the first reset transistor T1.

For example, principle of forming the gate electrode, the first electrode, and the second electrode of the compensation transistor T2, the driving transistor T3, the data writing transistor T4, the first light-emitting control transistor T5, the second light-emitting control transistor T6, and the second reset transistor T7 is similar to that of the first reset transistor T1, and will not be repeated here. It should be noted that, the signal lines used to form the gate electrodes of each transistor may further be located in different layers, which is not limited in the embodiments of the present disclosure.

Referring to FIG. 2-FIG. 7, the first end of the first active portion 504, that is, the first electrode of the first reset transistor T1, is arranged adjacent to the first connection portion 3022 of the first initialization signal line 302. The connection electrode L3 is arranged on a side of the first electrode of the first reset transistor T1 and the first connection portion 3022 away from the base substrate, and is used to electrically connect the first electrode of the first reset transistor T1 and the first connection portion 3022 at the position A1 through a via hole, so that the first electrode T1 of the first reset transistor T1 is electrically connected with the first initialization signal line 302. In the second direction Y, a certain spacing is provided between the first active portion 504 and the first body portion 3021 of the first initialization signal line 302, so that the orthographic projection of the first active portion 504 on the base substrate dose not overlap with the orthographic projection of the first body portion 3021 of the initialization signal line 302 on the base substrate, and the orthographic projection of the first active portion 504 on the base substrate dose not overlap with the orthographic projection of the light-emitting control signal line 304 on the base substrate, and therefore signal crosstalk between the first active portion 504 and the light-emitting control signal line 304 is reduced, so that the driving signal can be better controlled in the pixel circuit.

For example, referring to FIG. 3C-FIG. 6B, the plurality of active portions 503 further include a second active portion 505, the second active portion 505 extends in the second direction Y, and a first end of the second active portion 505 serves as the first electrode of the first light-emitting control transistor T5, an orthographic projection of the second active portion 505 on the base substrate at least partially overlaps with the orthographic projection of the first body portion 3021 of the first initialization signal line 302 on the base substrate.

Referring to FIG. 3C-FIG. 6B, the light-emitting control signal line 304 is arranged on a side of the second active portion 505 away from the base substrate, and a part of the light-emitting control signal line 304 overlapping with the second active portion 505 serves as the gate electrode of the first light-emitting control transistor T5, a part of the second active portion 505 corresponding to the gate electrode of the first light-emitting control transistor T5 serves as the channel region of the first light-emitting control transistor T5, the first electrode and the second electrode of the first light-emitting control transistor T5 are located on both sides of the channel region of the first light-emitting control transistor T5, respectively, and the second electrode of the first light-emitting control transistor T5 is closer to the driving transistor T3 than the first electrode of the first light-emitting control transistor T5.

Referring to FIG. 3C-FIG. 6B, the orthographic projection of the first body portion 3021 of the first initialization signal line 302 on the base substrate substantially coincides with the orthographic projection of the light-emitting control signal line 304 on the base substrate, so that the orthographic projection of the first body portion 3021 of the first initialization signal line 302 on the base substrate overlaps with the orthographic projection of the second active portion 505 on the base substrate. In the first direction X, two first connection portions 3022 closest to each other of the first initialization signal line 302 are located on both sides of the second active portion 505, respectively, and an orthographic projection of the two first connection portions 3022 on the base substrate does not overlap with the orthographic projection of the second active portion 505 on the base substrate. Such arrangement makes layout space design more reasonable and can reduce signal interference between various signal lines.

For example, referring to FIG. 2 and FIG. 7, the second initialization signal line 303 includes a second body portion 3031 and a second connection portion 3032, the second body portion 3031 extends in the first direction X, and one end of the second connection portion 3032 is connected with the second body portion 3031. The second connection portion 3032 extends in the second direction Y, and in the second direction Y, the second connection portion 3032 of the second initialization signal line 3031 is located on a side of the reset control signal line 301 closest to the second body portion 3031 of the second initialization signal line 303.

Referring to FIG. 2 and FIG. 7, an orthographic projection of the second body portion 3031 of the second initialization signal line 303 on the base substrate at least partially overlaps with the orthographic projection of the refresh gate line 305 on the base substrate, and the second body portion 3031 and the reset control signal line 301 are arranged at intervals in the second direction Y. The second electrode of the second reset transistor T7 is located on a side of the reset control signal line 301 close to the second body portion 3031, and therefore, by arranging the second connection portion 3032 on the side of the second body portion 3031 close to the reset control signal line 301 that is closest to the second body portion 3031, which facilitates to electrically connected with the first electrode of the second reset transistor T7 by the second connection portion 3032 at the position A2, and in addition make a line arrangement method on the layout suitable.

For example, referring to FIG. 2 and FIG. 7, the second body portion 3031 includes a first bent portion 3033, the reset control signal line 301 includes a second bent portion 3010, and in the second direction Y, the first bent portion 3033 is bent toward the reset control signal line 301 that is closest to the first bent portion 3033, and the second bent portion 3010 is bent toward the light-emitting control signal line 304 that is closest to the second bent portion 3010, and a bent direction of the first bent portion 3033 is the same as that of the second bent portion 3010.

Referring to FIG. 2 and FIG. 3C, the second bent portion 3010 is bent toward the light-emitting control signal line 304 that is closest to the second bent portion 3010, and the second bent portion 3010 overlaps with the active pattern, and a part of the second bent portion 3010 overlapping with the active pattern serves as the gate electrode of the second reset transistor T7. Arrangement of the second bent portion 3010 can make the reset control signal line 301 avoid the active pattern corresponding to the position A2, so that the first electrode of the second reset transistor T7 can be electrically connected with the second connection portion 3032 of the second initialization signal line 303 in enough space, which makes the layout design more reasonable.

For example, referring to FIG. 2, FIG. 3C and FIG. 7, the second connection portion 3032 includes a first combination portion 30321 and a second combination portion 30322 that are opposite to each other, and the plurality of active portions 503 further include a third active portion 506, the third active portion 506 extends in the second direction Y, a first end 5061 of the third active portion 506 serves as the first electrode of the second reset transistor T7, and a second end 5062 of the third active portion 506 serves as the second electrode of the second reset transistor T7, the first combination portion 30321 is connected with the first bent portion 3033, and the second combination portion 30322 is electrically connected with the first end of the third active portion 506.

Referring to FIG. 2, FIG. 3C and FIG. 7, the first end 5061 of the third active portion 506, that is, the first electrode of the second reset transistor T7 is arranged on a side of the third active portion 506 close to the second initialization signal line 303. In the second direction Y, the second connection portion 3032 extends from the first combination portion 30321 to the second combination portion 30322, and then is electrically connected with the first end of the third active portion 506 through the second combination portion 30222. This connection form is simplified, beneficial to the layout design, and easy to implement.

For example, referring to FIG. 2, FIG. 6B and FIG. 7, in the second direction Y, the first initialization signal line 302 is located between the first electrode of the first reset transistor T1 and the storage capacitor 400, and the orthographic projection of the first initialization signal line 302 on the base substrate does not overlap with the orthographic projection of the storage capacitor 400 on the base substrate.

Referring to FIG. 2, FIG. 6A-FIG. 7, the first electrode of the first reset transistor T1 is closer to the storage capacitor 400 than the second electrode of the first reset transistor T1, and the first reset transistor T1 is electrically connected with the first initialization signal line 302 through the connection electrode L3 at the position A1. As illustrated in FIG. 6B, the storage capacitor 400 is arranged adjacent to the light-emitting control signal line 304, the first body portion 3021 of the first initialization signal line 302 is arranged on the side of the light-emitting control signal line 304 away from the base substrate, and the orthographic projection of the first body portion 3021 on the base substrate substantially coincides with the orthographic projection of the light-emitting control signal line 304 on the base substrate. In this case, by making the first body portion 3021 avoid the position of the storage capacitor 400 in the second direction Y, signal crosstalk generated between the first initialization signal line 302 and the storage capacitor 400 through the first body portion 3021 can be reduced, and therefore it is beneficial to controlling the driving signal in the pixel circuit.

For example, referring to FIG. 4B-FIG. 6B, the pixel circuit further includes an active component 5300, the active component 5300 extends in the second direction Y, and the refresh gate line 305 includes a first refresh gate sub-line 3051 and a second refresh gate sub-line 3052, the first refresh gate sub-line 3051 and the second refresh gate sub-line 3052 both extend in the first direction X, and in a direction perpendicular to the base substrate, the first refresh gate sub-line 3051, the active component 5300, and the second refresh gate sub-line 3052 are arranged sequentially, and the second refresh gate sub-line 3052 is located on a side of the active component 5300 away from the base substrate.

For example, referring to FIG. 4C and FIG. 5B, an orthographic projection of the first refresh gate sub-line 3051 on the base substrate at least partially overlaps with an orthographic projection of the active component 5300 on the base substrate to form a first overlap region 3531.

For example, referring to FIG. 4C-FIG. 6B, an orthographic projection of the second refresh gate sub-line 3052 on the base substrate at least partially overlaps with an orthographic projection of the first overlap region 3531 on the base substrate to form a second overlap region 3532.

For example, referring to FIG. 4B-FIG. 6B, a portion of the first refresh gate sub-line 3051 and a portion of the second refresh gate sub-line 3052 located in the second overlap region 3532 serve as a top gate electrode and a bottom gate electrode of the gate electrode of the refresh control transistor T8, respectively, and the orthographic projection of the second initialization signal line 303 on the base substrate at least partially overlaps with an orthographic projection of the second overlap region 3532 on the base substrate.

For example, referring to FIG. 4B-FIG. 6B, the first refresh gate sub-line 3051, the active component 5300, and the second refresh gate sub-line 3052 of the refresh control transistor T8 are located in different layers, and a distance between the first refresh gate sub-line 3051 and the base substrates is the smallest, and the orthographic projection of the first refresh gate sub-line 3051 on the base substrate at least partially overlaps with the orthographic projection of the active pattern on the base substrate. In the second direction Y, the first refresh gate sub-line 3051 is located between the reset control signal line 301 and the scan control signal line 306; and the first refresh gate sub-line 3051, the reset control signal line 301, and the scan control signal line 306 are arranged at intervals.

Referring to FIG. 5A and FIG. 5B, the active component 5300 is located in the second active layer 530, the active component 5300 extends in the second direction Y, and is arranged on a side of the first refresh gate sub-line 3051 away from the base substrate, thereby forming a first overlap region 3531 with the first refresh gate sub-line 3051. For example, an area of the first overlap region 3531 is related to a size of the first refresh gate sub-line 3051 in the second direction Y and a size of the active component 5300 in the first direction X; therefore, in the embodiment of the present disclosure, the first overlap region 3531 can have different shapes and different sizes according to actual layout design requirements. An orthographic projection of one end of the active component 5300 on the base substrate at least partially overlaps with an orthographic projection of the active pattern close to the second electrode of the first reset transistor T1 on the base substrate, so as to facilitate an electrical connection with the second electrode of the first reset transistor T1; an orthographic projection of the other end of the active component 5300 on the base substrate at least partially overlaps with an orthographic projection of the scan control signal line 306 close to the storage capacitor 400 on the base substrate, so as to facilitate an electrical connection with the storage capacitor 400 or the driving transistor T3.

Referring to FIG. 5A and FIG. 6B, the second refresh gate sub-line 3052 is arranged on the side of the active component 5300 away from the base substrate, and is arranged oppositely with the first refresh gate sub-line 3051 in a direction perpendicular to the base substrate, and an orthographic projection of the second refresh gate sub-line 3052 on the base substrate at least partially overlaps with the first overlap region 3531, thereby forming the second overlap region 3532. For example, an area of the second overlap region 3532 depends on an area of the first overlap region 3531 and a size of the second refresh gate sub-line 3052 in the second direction Y. As illustrated in FIG. 6B, because the size of the second refresh gate sub-line 3052 in the second direction Y is small, the area of the second overlap region 3532 is smaller than the area of the first overlap region 3531. Portions of the first refresh gate sub-line 3531 and the second refresh gate sub-line 3532 whose orthographic projections on the base substrate overlap with the orthographic projection of the second overlap region 3532 on the base substrate serve as the gate electrode of the refresh control transistor T8, a portion of the active component 5300 located in the second overlap region 3532 serves as the channel region of the refresh control transistor T8.

For example, the active component 5300 may include the oxide semiconductor material. Because a transistor adopting oxide semiconductor has good hysteresis characteristic, low leakage current, and low mobility, it is possible to adopt an oxide semiconductor transistor to replace the low-temperature polysilicon material in the transistors to form a low-temperature polysilicon-oxide (LTPO) pixel circuit, and to achieve low leakage and improve stability of the gate electrode voltage of the transistor.

As illustrated in FIG. 6B, the second overlap region 3532 is in a middle region of the refresh gate line 305 in the second direction Y, and by at least partially overlapping the orthographic projection of the second initialization signal line 303 on the base substrate with the orthographic projection of the second overlap region 3532 on the base substrate, an overlap area between the second initialization signal line 303 and the refresh gate line 305 can be increased, and a layout area required to be occupied by a part of the second initialization signal line 303 that is arranged outside the refresh gate line 305 can be reduced, which is beneficial to the layout design and the control of the driving signal.

For example, referring to FIG. 2-FIG. 9, the display substrate further includes: a first conductive layer 510, a second conductive layer 520, a third conductive layer 540, a first connection layer 550, and a second connection layer 560. The active pattern is arranged on the base substrate, the first conductive layer 510, the second conductive layer 520, the third conductive layer 540, the first connection layer 550, and the second connection layer 560 are sequentially arranged on a side of the active pattern away from the base substrate in the direction perpendicular to the base substrate.

For example, as illustrated in FIG. 3C, the light-emitting control signal line 304, the reset control signal line 301, the scan control signal line 306, and the first electrode 401 of the storage capacitor are located in the first conductive layer 510.

For example, as illustrated in FIG. 4B, the first refresh gate sub-line 3051 and the second electrode 402 of the storage capacitor are located in the second conductive layer 520.

For example, referring to FIG. 6A and FIG. 6B, the first initialization signal line 302 and the second refresh gate sub-line 3052 are located in the third conductive layer 540.

For example, referring to FIG. 2 and FIG. 7, the second initialization signal line 303 is located in the first connection layer 550.

For example, referring to FIG. 8-FIG. 9, the display substrate further includes a plurality of data lines 307 and a plurality of power supply signal lines 308, and the plurality of data lines 307 and the plurality of power supply signal lines 308 are in the same layer as the second connection layer 560.

For example, the power supply signal line 308 is configured to supply the voltage signal VDD to the pixel circuit 100*a*. The data line 307 is configured to supply the data signal Vdata to the pixel circuit 100*a*.

As illustrated in FIG. 3C, the light-emitting control signal line 304, the reset control signal line 301, the scan control signal line 306, and the first electrode 401 of the storage capacitor are arranged at intervals in the second direction Y, and do not overlap with each other in the first conductive layer 510.

As illustrated in FIG. 4B, the first refresh gate sub-lines 3051 and the second electrodes 402 of the storage capacitor are arranged at intervals in the second direction Y, and do not overlap with each other in the second conductive layer 520. The second electrode 402 of the storage capacitor is opposite to the first electrode 401 of the storage capacitor in the direction perpendicular to the base substrate, so as to form the storage capacitor 400.

Referring to FIG. 5A and FIG. 5B, the first refresh gate sub-line 3051 serves as the bottom gate electrode of the refresh control transistor T8, and the active component 5300 is arranged on the side of the first refresh gate sub-line 3051 away from the base substrate, so as to form the first overlap region 3531.

Referring to FIG. 6A and FIG. 6B, the first initialization signal lines 302 and the second refresh gate sub-lines 3052 are arranged at intervals, and do not overlap with each other in the third conductive layer 540. The orthographic projection of the first initialization signal line 302 on the base substrate at least partially overlaps with the orthographic projection of the light-emitting control signal line 304 on the base substrate. The second refresh gate sub-line 3052 is arranged on the side of the active component 5300 away from the base substrate, and at least partially overlaps with the orthographic projection of the first overlap region 3531 on the base substrate, so as to form the gate electrode of the refresh control transistor T8.

As illustrated in FIG. 7, the first connection layer 550 includes a plurality of connection electrodes arranged at intervals and the second initialization signal line 303. The plurality of connection electrodes include a connection electrodes L1, a connection electrode L2, a connection electrode L3, a connection electrode L4, a connection electrode L5, a connection electrode L6, a connection electrode L7, and a connection electrode L8, so as to realize electrical connection of structures in the pixel circuit. The second initialization signal line 303 is arranged on the side of the refresh gate line 305 away from the base substrate, and the orthographic projection of the second initialization signal line 303 on the base substrate at least partially overlaps with the orthographic projection of the refresh gate line 305 on the base substrate, so that compared with arranging the second initialization signal line 303 on the side of the reset control signal line 301 away from the base substrate, the load on the reset control signal line 301 can be effectively reduced, which is beneficial to controlling the drive signal of the pixel circuit.

Referring to FIG. 2 and FIG. 9, the second connection layer 560 is arranged on the side of the first connection layer 550 away from the base substrate, and a plurality of data lines 307 and a plurality of power supply signal lines 308 are arranged in the second connection layer 560. The plurality of data lines 307 may be electrically connected with the data writing transistor T4 to supply data signals thereto. The plurality of power supply signal lines 308 may be electrically connected with the first light-emitting control transistor T5 to supply power signals thereto.

It should be noted that the structure of the pixel circuit in the above example is only exemplary, not restrictive. For example, the conductive layer or connection layer where each signal line is located may be determined according to actual layout design requirements, which is not limited in the embodiments of the present disclosure.

For example, referring to FIG. 2, FIG. 7 and FIG. 9, both the first connection layer 550 and the second connection layer 560 include a plurality of connection electrodes, the first connection layer 550 includes a first connection electrode L1, and the second connection layer 560 includes a second connection electrode L2, the first connection electrode L1 and the second connection electrode L2 are electrically connected through a first via hole N1, and the second connection electrode L2 is connected with the light-emitting element (such as the light-emitting element 100*b* in FIG. 1A) through a second via hole N2, and the second electrode of the second reset transistor T7 is connected with the first connection electrode L1 through a third via hole N3, and then electrically connected with the light-emitting element.

For example, the first connection electrode in the first connection layer 550 can be the same as the connection electrode L1 in FIG. 7, and the second connection electrode can be the same as the connection electrode L2 in FIG. 7, for clarity of illustration, the same reference numerals are adopted here.

For example, referring to FIG. 2, FIG. 7 and FIG. 9, the second electrode of the second reset transistor T7 is connected with the light-emitting element through the first connection electrode L1 and the second connection electrode L2, so that structure of the light-emitting element and its position on a side of the pixel circuit away from the base substrate can be flexibly arranged, which is beneficial to the layout design. For example, referring to FIG. 2, FIG. 7 and FIG. 9, an overlap area between the orthographic projection of the first initialization signal line 302 on the base substrate and orthographic projections of the first connection electrode L1 and the second connection electrode L2 on the base substrate is less than 5% of an area of an orthographic projection of the first connection electrode L1 on the base substrate.

For example, in some embodiments of the present disclosure, the orthographic projection of the first initialization signal line 302 on the base substrate does not overlap with the orthographic projections of the first connection electrode L1 and the second connection electrode L2 on the base substrate. For example, the overlap area between the orthographic projection of the first initialization signal line 302 on the base substrate and the orthographic projections of the first connection electrode L1 and the second connection electrode L2 on the base substrate is 2%-3% of the area of the orthographic projection of the first connection electrode L1 on the base substrate.

Therefore, it is possible to make that the orthographic projections of the first connection electrode L1 and the second connection electrode L2 on the base substrate have certain distances from the orthographic projection of the first initialization signal line 302 on the base substrate, so that each connection via hole (for example, the first via hole N1, the second via hole N2, and the third via hole N3) in the first connection electrode L1 and the second connection electrode L2 has certain distances from the first initialization signal line 302, and the probability of signal crosstalk can be reduced.

For example, as illustrated in FIG. 7, the first connection layer 550 further includes a third connection electrode L3, a fourth connection electrode L4, a fifth connection electrode L5, a sixth connection electrode L6, a seventh connection electrode L7, and an eighth connection electrode L8, and the second connection layer 560 further includes a ninth connection electrode L9.

For example, the third connection electrode in the first connection layer 550 can be the same as the connection electrode L3 in FIG. 7, the fourth connection electrode can be the same as the connection electrode L4 in FIG. 7, and the fifth connection electrode can be the same as the connection electrode L5, the sixth connection electrode can be the same as the connection electrode L6 in FIG. 7, the seventh connection electrode can be the same as the connection electrode L7 in FIG. 7, and the eighth connection electrode can be the same as the connection electrode L8 in FIG. 7. For clarity of illustration, the same reference numerals are adopted here.

For example, referring to FIG. 2 and FIG. 7, the first initialization signal line 302 is electrically connected with the third connection electrode L3 through a fourth via hole N4, and the first electrode of the first reset transistor T1 is connected with the third connection electrode L3 through a fifth via hole N5. The second electrode of the refresh control transistor T8 is electrically connected with the fourth connection electrode L4 through a sixth via hole N6, and the second electrode of the first reset transistor T1 is electrically connected with the fourth connection electrode L4 through a seventh via hole N7.

Therefore, the first electrode of the first reset transistor T1 can be connected with the first initialization signal line 302;

the second electrode of the first reset transistor T1 can be connected with the second electrode of the refresh control transistor T8.

For example, referring to FIG. 2 and FIG. 7, the first electrode of the compensation transistor T2 is electrically connected with the second electrode of the refresh control transistor T8 through a sixth via hole N6, and the orthographic projection of the fourth connection electrode L4 on the base substrate at least partially overlaps with the orthographic projection of the second initialization signal line 303 on the base substrate, which is beneficial to the layout design.

Referring to FIG. 2, FIG. 3C and FIG. 7, the second electrode of the compensation transistor T2, the second electrode of the second light-emitting control transistor T6, and the first electrode of the driving transistor T3 are connected with each other and are integrally formed.

For example, referring to FIG. 2, FIG. 6B and FIG. 7, the gate electrode of the driving transistor T3 is electrically connected with the storage capacitor 400 and the fifth connection electrode L5 through an eighth via hole N8, and the first electrode of the refresh control transistor T8 is electrically connected with the fifth connection electrode L5 through a via hole N9, thereby realizing an electrical connection between the first electrode of the refresh control transistor T8, the gate electrode of the driving transistor T3, and the storage capacitor 400.

For example, referring to FIG. 2, FIG. 6B-FIG. 9, the data writing transistor T4 is electrically connected with the sixth connection electrode L6 through a tenth via hole N10, and the sixth connection electrode L6 is connected with the data line 307 through an eleventh via hole N11, so that an electrical connection between the data writing transistor T4 and the data line 307 can be realized.

For example, as illustrated in FIG. 7, an orthographic projection of the sixth connection electrode L6 on the base substrate does not overlap with the orthographic projection of the second initialization signal line 303 on the base substrate, thereby reducing signal crosstalk between the data line 307 and the second initialization signal line 303, which is beneficial to the layout design.

For example, referring to FIG. 2 and FIG. 6B-FIG. 9, the first light-emitting control transistor T5 is electrically connected with the seventh connection electrode L7 through a twelfth via hole N12, and the seventh connection electrode L7 is connected with the power supply signal line 308 through a thirteenth via hole N13, so that an electrical connection between the first light-emitting control transistor T5 and the power supply signal line 308 can be realized. Meanwhile, an orthographic projection of the thirteenth via hole N13 on the base substrate at least partially overlaps with the orthographic projection of the first initialization signal line 303 on the base substrate, so as to optimize a space area and facilitate the layout design.

For example, referring to FIG. 2, FIG. 7-FIG. 9, the first electrode of the second light-emitting control transistor T6 is electrically connected with the eighth connection electrode L8 through a fourteenth via hole N14, and the eighth connection electrode L8 is electrically connected with the ninth connection electrode L9 through a fifteenth via hole N15, and the ninth connection electrode L9 is electrically connected with the light-emitting element through the sixteenth via hole N16, thereby realizing an electrical connection between the first electrode of the second light-emitting control transistor T6 and the light-emitting element. Moreover, orthographic projections of the eighth connection electrode L8 and the ninth connection electrode L9 on the base substrate substantially do not overlap with the orthographic projection of the first initialization signal line 302 on the base substrate, so as to reduce signal crosstalk between the second light-emitting control transistor T6 and the first initialization signal line 302, which optimizes the layout design.

For example, referring to FIG. 2, FIG. 6B, and FIG. 9, in the second direction Y, the fourth via hole N4, the fifth via hole N5, the twelfth via hole N12, the fourteenth via hole N14 and the fifteenth via hole N15 are located between the light-emitting control signal line 304 and the reset control signal line 301. The sixth via hole N6, the seventh via hole N7, the tenth via hole N10, and the eleventh via hole N11 are located between the reset control signal line 301 and the second initialization signal line 303. Orthographic projections of the via holes on the base substrate do not overlap with each other.

For example, as illustrated in FIG. 6B, the ninth via hole N9 is located between the second initialization signal line 303 and the storage capacitor 400, and the orthographic projection of the ninth via hole N9 on the base substrate at least partially overlaps with the orthographic projection of the scan control signal line 306, which facilitates layout space utilization and design.

Referring to FIG. 1A-FIG. 2, at least one embodiment of the present disclosure further provides a display substrate, including: a base substrate, a plurality of sub-pixels 100, and a plurality of signal lines 300.

Referring to FIG. 1A-FIG. 2, a plurality of sub-pixels 100 are located on the base substrate, the sub-pixel 100 includes a light-emitting element **100*b* and a pixel circuit 100*a*, the pixel circuit 100*a* is configured to drive the light-emitting element 100*b*, and the pixel circuit 100*a* includes a plurality of transistors 200 and a storage capacitor 400**, each transistor includes a gate electrode, a first electrode, and a second electrode.

Referring to FIG. 1A-FIG. 2, a plurality of signal lines 300 are arranged on the base substrate, the plurality of signal lines 300 include an initialization signal line 700 and a reset control signal line 301. The initialization signal line 700 is configured to supply an initialization signal to the pixel circuit **100*a*, and the reset control signal line 301 is configured to supply a reset control signal to the pixel circuit 100*a***.

Referring to FIG. 1A-FIG. 2, the plurality of transistors 200 include a reset transistor TF, a gate electrode of the reset transistor TF is connected with the reset control signal line 301, a first electrode of the reset transistor TF is connected with the initialization signal line 700, and the reset transistor TF is configured to reset a first electrode 401 of the storage capacitor or a first electrode of the light-emitting element **100*b***.

As illustrated in FIG. 2, an orthographic projection of the initialization signal line 700 on the base substrate does not overlap with an orthographic projection of the reset control signal line 301 on the base substrate.

For example, referring to FIG. 1A-FIG. 2, the plurality of signal lines 300 arranged on the base substrate may include one initialization signal line 700, or may include a plurality of initialization signal lines 700. For example, the plurality of signal lines 300 may include two initialization signal lines 700.

In the display substrate provided by the embodiments of the present disclosure, structure of the pixel circuit **100*a* is optimized based on the LTPO technology, by reducing a signal line whose orthographic projection on the base substrate overlapping with the orthographic projection of the reset control signal line 301 on the base substrate, for example, the orthographic projection of the initialization signal line 700 on the base substrate substantially does not overlap with the orthographic projection of the reset control signal line 301 on the base substrate, a load on the reset control signal line 301** can be reduced without adding more processes, which is helpful for alleviating the display defects (for example, Mura) under the low grayscale, contributing to the brightness uniformity under high-frequency driving, and is helpful for improving display quality; in addition, this scheme makes the layout of the pixel circuit is simpler and more reasonable, and easy to implement.

For example, referring to FIG. 2, the reset transistor TF includes a first reset transistor T1, the initialization signal line 700 includes a first initialization signal line 302, and the first reset transistor T1 is configured to reset the first electrode 401 of the storage capacitor. An orthographic projection of the first initialization signal line 302 on the base substrate does not overlap with the orthographic projection of the reset control signal line 301 on the base substrate.

For example, the initialization signal line 700 is arranged in only one type, that is, the initialization signal line 700 only includes the first initialization signal line 302, and therefore, by making the orthographic projection of the first initialization signal line 302 on the base substrate does not overlap with the orthographic projection of the reset control signal line 301 on the base substrate, impact of the first initialization signal line 302 on the load of the reset control signal line 301 can be reduced, which facilitates control of the driving signal in the pixel circuit.

For example, referring to FIG. 2, the reset transistor TF includes a second reset transistor T7, the initialization signal line 700 includes a second initialization signal line 303, and the second reset transistor T7 is configured to reset the first electrode of the light-emitting element 100*b*. An orthographic projection of the second initialization signal line 303 on the base substrate does not overlap with the orthographic projection of the reset control signal line 301 on the base substrate.

For example, the initialization signal line 700 is arranged in only one type, that is, the initialization signal line 700 only includes the second initialization signal line 303, and therefore, by making the orthographic projection of the second initialization signal line 303 on the base substrate does not overlap with the orthographic projection of the reset control signal line 301 on the base substrate, impact of the second initialization signal line 303 on the load of the reset control signal line 301 can be reduced, which facilitates control of the driving signal in the pixel circuit.

For example, as illustrated in FIG. 2, two types of initialization signal lines 700 can further be arranged, that is, the initialization signal line 700 includes the first initialization signal line 302 and the second initialization signal line 303, and the embodiments of the present disclosure do not limit a number and a type of the initialization signal line 700.

For example, referring to FIG. 1B, FIG. 2 and FIG. 4B-FIG. 6B, the plurality of transistors 200 further include a refresh control transistor T8, a first electrode of the refresh control transistor T8 is electrically connected with the first electrode 401 of the storage capacitor, and a second electrode of the refresh control transistor T8 is electrically connected with a second electrode of the first reset transistor T1, and the plurality of signal lines 300 further include a refresh gate line 305, which extends in a first direction X, and a gate electrode of the refresh control transistor T8 is electrically connected with the refresh gate line 305; the orthographic projection of the second initialization signal line 303 on the base substrate at least partially overlaps with an orthographic projection of the refresh gate line 305 on the base substrate, so as to reduce the load on the reset control signal line 304.

Referring to FIG. 1B, FIG. 2 and FIG. 4B-6B, the refresh control transistor T8 may be an oxide transistor, a gate line of the refresh transistor T8 is the refresh gate line 305, and the gate electrode of the refresh control transistor T8 is electrically connected with the refresh gate line 305. The first electrode of the refresh control transistor T8 is located on a side of the refresh control transistor T8 close to the first reset transistor T1, and the second electrode of the refresh control transistor T8 is located on a side of the refresh control transistor T8 away from the first reset transistor T1. The first electrode of the refresh control transistor T8 is electrically connected with the first electrode 401 of the storage capacitor at a position A6 through a connection electrode L5, and the second electrode of the refresh control transistor T8 is electrically connected with the second electrode of the first reset transistor T1 through a connection electrode L4 at a position A5. It can be seen from FIG. 2 that the first electrode of the refresh control transistor T8 is far away from the first electrode 401 of the storage capacitor, by arranging the connection electrode L5, an electrical connection between the first electrode of the refresh control transistor T8 and the first electrode 401 of the storage capacitor can be realized without adding more processes, which is beneficial to the layout design.

Referring to FIG. 1B, FIG. 2 and FIG. 4B-FIG. 6B, an increase of the load on the refresh gate line 305 has little effect on the driving control of the pixel circuit 100*a*, by arranging the compensation transistor T2 on a side of the refresh gate line 305 of the refresh control transistor T8 away from the reset control signal line 301, the load on the reset control signal line 301 can be greatly reduced, which is beneficial to a control of a driving signal in the pixel circuit and the layout design. A reason why the increase of the load on the refresh gate line 305 has little effect on the driving control of the pixel circuit 100*a* can be referred to the relevant description of the above-mentioned embodiments, and will not be repeated here.

For example, referring to FIG. 1B-FIG. 9, the plurality of transistors 200 further include a driving transistor T3 and a light-emitting control transistor T56, and the plurality of signal lines 300 further include a light-emitting control signal line 304, and the light-emitting control signal line 304 extends in the first direction X. A first electrode of the light-emitting control transistor T56 is electrically connected with a second electrode of the second reset transistor T7, a gate electrode of the light-emitting control transistor T56 is electrically connected with the light-emitting control signal line 304, and a second electrode of the light-emitting control transistor T56 is connected with the driving transistor T3. The orthographic projection of the first initialization signal line 302 on the base substrate at least partially overlaps with an orthographic projection of the light-emitting control signal line 304 on the base substrate.

For example, referring to FIG. 2, the number of the light-emitting control transistor T56 may be one, or more. For example, the light-emitting control transistor T56 may include a first light-emitting control transistor T5 and a second light-emitting control transistor T6, the embodiments of the present disclosure do not limit the number of the light-emitting control transistors T56.

For example, referring to FIG. 2 and FIG. 6B, by making the orthographic projection of the first initialization signal line 302 on the base substrate at least partially overlaps with the orthographic projection of the light-emitting control signal line 304 on the base substrate, the load on the reset control signal line 304 can be reduced, which facilitates the control of the driving signal.

For example, a structural characteristic, a connection method, and a selection of arrangement position of the pixel circuit in the display substrate provided by this embodiment can refer to descriptions of the above embodiments, and will not be repeated here.

Figure 10:
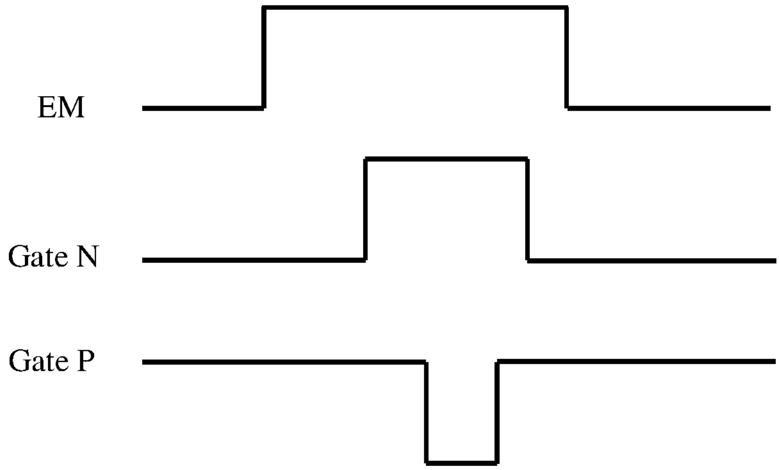
FIG. 10 is a timing chart of a pixel circuit when performing driving in a display substrate provided by at least one embodiment of the present disclosure.
Figure 11:
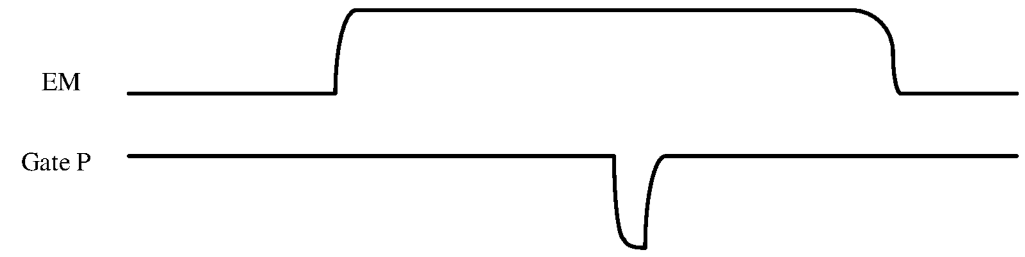
FIG. 11 is another timing chart of a pixel circuit when performing driving in a display substrate provided by at least one embodiment of the present disclosure.
Figure 12:
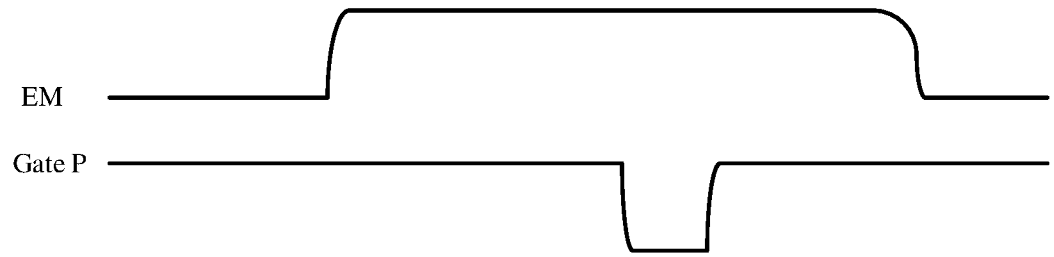
FIG. 12 is another timing chart of a pixel circuit when performing driving in a display substrate provided by at least one embodiment of the present disclosure.

FIG. 10 is a timing chart of a pixel circuit when performing driving in a display substrate provided by at least one embodiment of the present disclosure. FIG. 11 is another timing chart of a pixel circuit when performing driving in a display substrate provided by at least one embodiment of the present disclosure. FIG. 12 is another timing chart of a pixel circuit when performing driving in a display substrate provided by at least one embodiment of the present disclosure.

As illustrated in FIG. 10, because the load on the reset control signal line directly determines the threshold compensation effect of the driving transistor, the embodiments of the present disclosure reduce the signal lines overlapping with the reset control signal line, so that time when the reset control signal is at a low level is relatively extended. FIG. 10 illustrates a timing chart in which the orthographic projections of the first initialization signal line and the second initialization signal line in the display substrate on the base substrate do not overlap with the orthographic projection of the reset control signal line on the base substrate.

As illustrated in FIG. 10, time when a light-emitting control signal EM is at a high level is the longest, which is a first time period; time when a gate signal Gate N corresponding to an oxide transistor is at a high level is second, which is a second time period, and the second time period is within the first time period; time when a reset control signal Gate P is at a non-high level is the shortest, which is a third time period, and the third time period is shorter than the first time period and is shorter than the second time period, and the third time period is within an overlapping time period of the first time period and the second time period. According to FIG. 10, it can be seen that the reset control signal Gate P is at a low level for a long time in the third time period, and fall time and rise time of the reset control signal Gate P switching between the high level and the low level are short, and switching time is less than 10% of the third time period. Therefore, time for the reset control signal Gate P at a low level can be relatively sufficient, so as to facilitate to preform corresponding control operation on the driving signal and to facilitate the control of the driving signal.

For example, as illustrated in FIG. 11, at a high driving frequency (for example, 120 Hz), the fall time and rise time of the reset control signal Gate P switching between the high level and the low level are relatively long, as a result, time when the reset control signal Gate P is completely at the low level accounts for a relatively low proportion of the third time period. As illustrated in FIG. 12, at a low driving frequency (for example, 60 Hz), the fall time and rise time of the reset control signal Gate P switching between the high level and the low level are relatively short, so that the reset control signal Gate P completely at the low level accounts for a relatively large proportion of the third time period.

Referring to FIG. 11-FIG. 12, at different driving frequencies, time for the light-emitting control signal EM to remain in a low-level state is different, and the time for the light-emitting control signal EM to remain in the low-level state is much shorter than time for the light-emitting control signal EM to remain in a high-level state. Therefore, even if the first initialization signal line overlaps with the light-emitting control signal line, which make the load of the light-emitting control signal EM increase and fall time and rise time of the light-emitting control signal EM switching between a high level and a low level increase, it can still be ensured that first time period when the light-emitting control signal EM is at the high level completely covers a third time period when the reset control signal Gate P is at the low level, which has small influence on the control of the signal driving.

Therefore, in the display substrate provided by the embodiments of the present disclosure, structure of the pixel circuit is optimized based on the LTPO technology, by reducing a signal line whose orthographic projection on the base substrate overlapping with the orthographic projection of the reset control signal line on the base substrate, a load on the reset control signal line can be reduced, which is helpful for alleviating the display defects (for example, Mura) under the low grayscale, contributing to the brightness uniformity under high-frequency driving, and improving display quality. Moreover, this scheme has little effect on the driving control of the pixel circuit, and makes the line arrangement of the pixel circuit is reasonable, space is suitable, and easy to implement.

At least one embodiment of the present disclosure further provides a display device, including the display substrate described in any one of the embodiments of the present disclosure.

FIG. 6 is a schematic diagram of a display device provided by at least one embodiment of the present disclosure.

On a basis of fully considering the driving principle of the driving signal and by optimizing layout arrangement of the signal lines in the pixel circuit, the display device provided by the embodiments of the present disclosure is beneficial to reducing the load on the reset control signal line in the pixel circuit, and optimizing the control of the drive signal in the display device.

For example, the display device provided by the embodiments of the present disclosure may be an organic light-emitting diode display device.

For example, the display device may further include a cover plate on a side of a display side of the display substrate.

For example, the display device may be any product or component with a display function, such as a mobile phone, a tablet computer, a notebook computer, and a navigator with an under-screen camera, and the embodiments are not limited to this.

For example, the display device 60 can be any product or component with a display function, such as a liquid crystal panel, an electronic paper, an OLED panel, a mobile phone, a tablet computer, a television, a monitor, a notebook computer, a digital photo frame, or a navigator, which are not limited in the embodiments of the present disclosure.

For the technical effects of the manufacturing method of the display substrate provided by the embodiment of the present disclosure, please refer to the technical effects of the display substrate provided by the embodiment of the present disclosure, and will not be repeated here.

For the present disclosure, the following statements need to be explained.

(1) The drawings of the embodiments of the present disclosure only relate to the structure related to the embodiment of the present disclosure, and other structures can refer to the common design(s).

(2) For the sake of clarity, a thickness of a layer or structure may be enlarged in the drawings for describing the embodiments of the present disclosure. It should be understood that in the case where an element such as a layer, film, region or substrate is referred to as being “on” or “under” another element, the element may be “directly” “on” or “under” the another element, or an intervening element may be present therebetween.

(3) In case of no conflict, the features in the same embodiment and in different embodiments of the present disclosure can be combined with each other.

What have been described above are only specific implementations of the present disclosure, and the protection scope of the present disclosure is not limited thereto. The protection scope of the present disclosure should be based on the protection scope of the claims.

What is claimed is:

1. A display substrate, comprising:

a base substrate, a plurality of sub-pixels, located on the base substrate, wherein each of the plurality of sub-pixels comprises a light-emitting element and a pixel circuit, the pixel circuit is configured to drive the light-emitting element, the pixel circuit comprises a plurality of transistors and a storage capacitor, each of the plurality of transistors comprises a gate electrode, a first electrode, and a second electrode;

a plurality of signal lines, arranged on the base substrate, comprising a first initialization signal line, a reset control signal line, and a second initialization signal line which extend in a first direction and are arranged in a second direction, wherein the reset control signal line is configured to supply a reset control signal to the pixel circuit, the first initialization signal line is configured to supply a first initialization signal to the pixel circuit, and the second initialization signal line is configured to supply a second initialization signal to the pixel circuit, the second direction intersects with the first direction, wherein:

the plurality of transistors comprise a first reset transistor and a second reset transistor, a first electrode of the first reset transistor is electrically connected with the first initialization signal line, and a gate electrode of the first reset transistor and a gate electrode of the second reset transistor are electrically connected with the reset control signal line, a first electrode of the second reset transistor is electrically connected with the second initialization signal line, and a second electrode of the second reset transistor is electrically connected with the light-emitting element;

an orthographic projection of at least one of the first initialization signal line and the second initialization signal line on the base substrate does not overlap with an orthographic projection of the reset control signal line on the base substrate;

the plurality of transistors further comprise a driving transistor, a first light-emitting control transistor, and a second light-emitting control transistor, and the plurality of signal lines further comprise a light-emitting control signal line, the light-emitting control signal line extends in the first direction;

a first electrode of the first light-emitting control transistor is electrically connected with a second electrode of the storage capacitor, a first electrode of the second light-emitting control transistor is electrically connected with the second electrode of the second reset transistor, and a gate electrode of the first light-emitting control transistor and a gate electrode of the second light-emitting control transistor are electrically connected with the light-emitting control signal line, and a second electrode of the second light-emitting control transistor and a second electrode of the first light-emitting control transistor are connected with a first electrode and a second electrode of the driving transistor, respectively, and a gate electrode of the driving transistor is connected with a first electrode of the storage capacitor; and an orthographic projection of the first initialization signal line on the base substrate at least partially overlaps with an orthographic projection of the light-emitting control signal line on the base substrate.

2. The display substrate according to claim 1, wherein the plurality of transistors further comprise a refresh control transistor, a first electrode of the refresh control transistor is electrically connected with a first electrode of the storage capacitor, a second electrode of the refresh control transistor is electrically connected with a second electrode of the first reset transistor, the plurality of signal lines further comprise a refresh gate line, the refresh gate line extends in the first direction, a gate electrode of the refresh control transistor is electrically connected with the refresh gate line, and the orthographic projection of the second initialization signal line on the base substrate at least partially overlaps with an orthographic projection of the refresh gate line on the base substrate.

3. The display substrate according to claim 1, wherein the first initialization signal line and the second initialization signal line are arranged to be spaced apart in the second direction.

4. The display substrate according to claim 2, wherein the plurality of signal lines further comprise a scan control signal line, the scan control signal line extends in the first direction;

the plurality of transistors further comprise a compensation transistor and a data writing transistor, and the scan control signal line is electrically connected with a gate electrode of the compensation transistor and a gate electrode of the data writing transistor, respectively, in the second direction, the reset control signal line, the refresh gate line, and the scan control signal line are arranged sequentially, and the orthographic projection of the second initialization signal line on the base substrate does not overlap with an orthographic projection of the scan control signal line on the base substrate, wherein, in the second direction, the first initialization signal line, the reset control signal line, the second initialization signal line, the scan control signal line, and the storage capacitor are sequentially arranged at intervals, and a minimum spacing between the reset control signal line and the second initialization signal line is greater than a minimum spacing between the refresh gate line and the storage capacitor.

5. The display substrate according to claim 1, wherein the first initialization signal line comprises a first body portion and at least one first connection portion, the first body portion extends in the first direction, and an orthographic projection of the first body portion on the base substrate at least partially overlaps with the orthographic projection of the light-emitting control signal line on the base substrate, the at least one first connection portion is connected with the first body portion, in the second direction, an orthographic projection of the at least one first connection portion on the base substrate is located between the orthographic projection of the light-emitting control signal line on the base substrate and the orthographic projection of the reset control signal line on the base substrate, wherein the pixel circuit comprises an active pattern, the active pattern comprises a channel region and a source and drain region of the transistor, and the active pattern comprises a plurality of active portions, and each of the plurality of active portions comprises a first end and a second end located on both sides of the channel region.

6. The display substrate according to claim 5, wherein the plurality of active portions comprise a first active portion, the first active portion extends in the second direction, a first end of the first active portion serves as the first electrode of the first reset transistor, a second end of the first active portion serves as a second electrode of the first reset transistor, and an orthographic projection of first active portion on the base substrate does not overlap with the orthographic projection of the first body portion of the first initialization signal line on the base substrate, wherein the plurality of active portions further comprise a second active portion, the second active portion extends in the second direction, a first end of the second active portion serves as the first electrode of the first light-emitting control transistor, and an orthographic projection of the second active portion on the base substrate at least partially overlap with the orthographic projection of the first body portion of the first initialization signal line on the base substrate.

7. The display substrate according to claim 5, wherein the second initialization signal line comprises a second body portion and a second connection portion, the second body portion extends in the first direction, one end of the second connection portion is connected with the second body portion, the second connection portion of the second initialization signal line is located on a side of the reset control signal line that is closest to the second body portion of the second initialization signal line.

8. The display substrate according to claim 7, wherein the second body portion comprises a first bent portion, the reset control signal line comprises a second bent portion, in the second direction, the first bent portion is bent toward the reset control signal line that is closest thereto, and the second bent portion is bent toward the light-emitting control signal line that is closest thereto, and a bent direction of the first bent portion is the same as a bent direction of the second bent portion, wherein the second connection portion comprises a first combination portion and a second combination portion that are opposite to each other, the plurality of active portions further comprise a third active portion, the third active portion extends in the second direction, and a first end of the third active portion serves as the first electrode of the second reset transistor, a second end of the third active portion serves as the second electrode of the second reset transistor, the first combination portion is connected with the first bent portion, and the second combination portion is electrically connected with the first end of the third active portion.

9. The display substrate according to claim 1, wherein in the second direction, the first initialization signal line is located between the first electrode of the first reset transistor and the storage capacitor, and the orthographic projection of the first initialization signal line on the base substrate does not overlap with an orthographic projection of the storage capacitor on the base substrate.

10. The display substrate according to claim 2, wherein the pixel circuit further comprises an active component, the active component extends in the second direction, the refresh gate line comprises a first refresh gate sub-line and a second refresh gate sub-line, the first refresh gate sub-line and the second refresh gate sub-line both extend in the first direction, and in a direction perpendicular to the base substrate, the first refresh gate sub-line, the active component, and the second refresh gate sub-line are arranged sequentially, and the second refresh gate sub-line is located on a side of the active component away from the base substrate;

an orthographic projection of the first refresh gate sub-line on the base substrate at least partially overlaps with an orthographic projection of the active component on the base substrate to form a first overlap region, an orthographic projection of the second refresh gate sub-line on the base substrate at least partially overlaps with an orthographic projection of the first overlap region on the base substrate to form a second overlap region, a portion of the first refresh gate sub-line and a portion of the second refresh gate sub-line that are located in the second overlap region serve as a top gate electrode and a bottom gate electrode of the gate electrode of the refresh control transistor, respectively, and the orthographic projection of the second initialization signal line on the base substrate at least partially overlaps with an orthographic projection of the second overlap region on the base substrate.

11. The display substrate according to claim 10, further comprising: a first conductive layer, a second conductive layer, a third conductive layer, a first connection layer, and a second connection layer, the active pattern is arranged on the base substrate, the first conductive layer, the second conductive layer, the third conductive layer, the first connection layer, and the second connection layer are sequentially arranged on a side of the active pattern away from the base substrate in a direction perpendicular to the base substrate, the light-emitting control signal line, the reset control signal line, the scan control signal line, and the first electrode of the storage capacitor are located in the first conductive layer;

the first refresh gate sub-line and the second electrode of the storage capacitor are located in the second conductive layer;

the first initialization signal line and the second refresh gate sub-line are located in the third conductive layer;

the second initialization signal line is located in the first connection layer;

the display substrate further comprises a plurality of data lines and a plurality of power supply signal lines, and the plurality of data lines and the plurality of power supply signal lines are in the same layer as the second connection layer.

12. The display substrate according to claim 11, wherein both the first connection layer and the second connection layer comprise a plurality of connection electrodes, the first connection layer comprises a first connection electrode, the second connection layer comprises a second connection electrode, and the first connection electrode and the second connection electrode are electrically connected through a first via hole, and the second connection electrode is electrically connected with the light-emitting element through a second via hole, the second electrode of the second reset transistor is connected with the first connection electrode through a third via hole, and is further electrically connected with the light-emitting element, an overlap area between the orthographic projection of the first initialization signal line on the base substrate and orthographic projections of the first connection electrode and the second connection electrode on the base substrate is less than 5% of an area of an orthographic projection of the first connection electrode on the base substrate.

13. The display substrate according to claim 12, wherein the first connection layer further comprises a third connection electrode, a fourth connection electrode, a fifth connection electrode, a sixth connection electrode, a seventh connection electrode, and an eighth connection electrode, the second connection layer further comprises a ninth connection electrode, the first initialization signal line is electrically connected with the third connection electrode through a fourth via hole, the first electrode of the first reset transistor is electrically connected with the third connection electrode through a fifth via hole, and the second electrode of the refresh control transistor is electrically connected with the fourth connection electrode through a sixth via hole, and the second electrode of the first reset transistor is electrically connected with the fourth connection electrode through a seventh via hole;

a first electrode of the compensation transistor is electrically connected with the second electrode of the refresh control transistor through the sixth via hole, and an orthographic projection of the fourth connection electrode on the base substrate at least partially overlaps with the orthographic projection of the second initialization signal line on the base substrate;

the gate electrode of the driving transistor is electrically connected with the storage capacitor and the fifth connection electrode through an eighth via hole, and the first electrode of the refresh control transistor is electrically connected with the fifth connection electrode through a ninth via hole;

the data writing transistor is electrically connected with the sixth connection electrode through a tenth via hole, the sixth connection electrode is electrically connected with the data line through an eleventh via hole, an orthographic projection of the sixth connection electrode on the base substrate does not overlap with the orthographic projection of the second initialization signal line on the base substrate;

the first light-emitting control transistor is electrically connected with the seventh connection electrode through a twelfth via hole, and the seventh connection electrode is electrically connected with the power supply signal line through a thirteenth via hole, and an orthographic projection of the thirteenth via hole on the base substrate at least partially overlaps with the orthographic projection of the first initialization signal line on the base substrate;

the first electrode of the second light-emitting control transistor is electrically connected with the eighth connection electrode through a fourteenth via hole, and the eighth connection electrode is electrically connected with the ninth connection electrode through a fifteenth via hole, the ninth connection electrode is electrically connected with the light-emitting element through a sixteenth via hole, and orthographic projections of the eighth connection electrode and the ninth connection electrode on the base substrate substantially do not overlap with the orthographic projection of the first initialization signal line on the base substrate, wherein, in the second direction, the fourth via hole, the fifth via hole, the twelfth via hole, the fourteenth via hole, and the fifteenth via hole are located between the light-emitting control signal line and the reset control signal line;

the sixth via hole, the seventh via hole, the tenth via hole, and the eleventh via hole are located between the reset control signal line and the second initialization signal line;

the ninth via hole is located between the second initialization signal line and the storage capacitor, and an orthographic projection of the ninth via hole on the base substrate at least partially overlaps with an orthographic projection of the scan control signal line on the base substrate.

14. A display substrate, comprising:

a base substrate;

a plurality of sub-pixels, located on the base substrate, wherein each of the plurality of sub-pixels comprises a light-emitting element and a pixel circuit, the pixel circuit is configured to drive the light-emitting element, the pixel circuit comprises a plurality of transistors and a storage capacitor, each transistor of the plurality of transistors comprises a gate electrode, a first electrode, and a second electrode;

a plurality of signal lines, arranged on the base substrate, comprising an initialization signal line and a reset control signal line, wherein the initialization signal line is configured to supply an initialization signal to the pixel circuit, and the reset control signal line is configured to supply a reset control signal to the pixel circuit, wherein:

the plurality of transistors comprise a reset transistor, a gate electrode of the reset transistor is connected with the reset control signal line, a first electrode of the reset transistor is connected with the initialization signal line, and the reset transistor is configured to reset a first electrode of the storage capacitor or a first electrode of the light-emitting element;

an orthographic projection of the initialization signal line on the base substrate does not overlap with an orthographic projection of the reset control signal line on the base substrate;

the reset transistor comprises a first reset transistor, the initialization signal line comprises a first initialization signal line, and the first reset transistor is configured to reset the first electrode of the storage capacitor; and an orthographic projection of the first initialization signal line on the base substrate does not overlap with the orthographic projection of the reset control signal line on the base substrate.

15. The display substrate according to claim 14, wherein the reset transistor comprises a second reset transistor, the initialization signal line comprises a second initialization signal line, the second reset transistor is configured to reset the first electrode of the light-emitting element, and an orthographic projection of the second initialization signal line on the base substrate does not overlap with the orthographic projection of the reset control signal line on the base substrate.

16. The display substrate according to claim 15, wherein the plurality of transistors further comprise a refresh control transistor, a first electrode of the refresh control transistor is electrically connected with the first electrode of the storage capacitor, and a second electrode of the refresh control transistor is connected with a second electrode of the first reset transistor, the plurality of signal lines further comprise a refresh gate line, the refresh gate line extends in a first direction, and a gate electrode of the refresh control transistor is electrically connected with the refresh gate line;

the orthographic projection of the second initialization signal line on the base substrate at least partially overlaps with an orthographic projection of the refresh gate line on the base substrate.

17. The display substrate according to claim 15, wherein the plurality of transistors further comprise a driving transistor and a light-emitting control transistor, and the plurality of signal lines further comprise a light-emitting control signal line, and the light-emitting control signal line extends in a first direction, a first electrode of the light-emitting control transistor is electrically connected with a second electrode of the second reset transistor, a gate electrode of the light-emitting control transistor is electrically connected with the light-emitting control signal line, and a second electrode of the light-emitting control transistor is connected with the driving transistor, the orthographic projection of the first initialization signal line on the base substrate at least partially overlaps with an orthographic projection of the light-emitting control signal line on the base substrate.

18. A display device, comprising the display substrate according to claim 1.

19. A display substrate, comprising:

a base substrate, a plurality of sub-pixels, located on the base substrate, wherein each of the plurality of sub-pixels comprises a light-emitting element and a pixel circuit, the pixel circuit is configured to drive the light-emitting element, the pixel circuit comprises a plurality of transistors and a storage capacitor, each of the plurality of transistors comprises a gate electrode, a first electrode, and a second electrode;

a plurality of signal lines, arranged on the base substrate, comprising a first initialization signal line, a reset control signal line, and a second initialization signal line which extend in a first direction and are arranged in a second direction, wherein the reset control signal line is configured to supply a reset control signal to the pixel circuit, the first initialization signal line is configured to supply a first initialization signal to the pixel circuit, and the second initialization signal line is configured to supply a second initialization signal to the pixel circuit, the second direction intersects with the first direction, wherein the plurality of transistors comprise a first reset transistor and a second reset transistor, a first electrode of the first reset transistor is electrically connected with the first initialization signal line, and a gate electrode of the first reset transistor and a gate electrode of the second reset transistor are electrically connected with the reset control signal line, a first electrode of the second reset transistor is electrically connected with the second initialization signal line, and a second electrode of the second reset transistor is electrically connected with the light-emitting element, an orthographic projection of at least one of the first initialization signal line and the second initialization signal line on the base substrate does not overlap with an orthographic projection of the reset control signal line on the base substrate, wherein the plurality of transistors further comprise a driving transistor, a first light-emitting control transistor, and a second light-emitting control transistor, and the plurality of signal lines further comprise a light-emitting control signal line, the light-emitting control signal line extends in the first direction, a first electrode of the first light-emitting control transistor is electrically connected with a second electrode of the storage capacitor, a first electrode of the second light-emitting control transistor is electrically connected with the second electrode of the second reset transistor, and a gate electrode of the first light-emitting control transistor and a gate electrode of the second light-emitting control transistor are electrically connected with the light-emitting control signal line, and a second electrode of the second light-emitting control transistor and a second electrode of the first light-emitting control transistor are connected with a first electrode and a second electrode of the driving transistor, respectively, and a gate electrode of the driving transistor is connected with a first electrode of the storage capacitor, an orthographic projection of the first initialization signal line on the base substrate at least partially overlaps with an orthographic projection of the light-emitting control signal line on the base substrate, wherein the plurality of transistors further comprise a refresh control transistor, a first electrode of the refresh control transistor is electrically connected with a first electrode of the storage capacitor, a second electrode of the refresh control transistor is electrically connected with a second electrode of the first reset transistor, the plurality of signal lines further comprise a refresh gate line, the refresh gate line extends in the first direction, a gate electrode of the refresh control transistor is electrically connected with the refresh gate line, and the orthographic projection of the second initialization signal line on the base substrate at least partially overlaps with an orthographic projection of the refresh gate line on the base substrate.

20. The display substrate according to claim 19, wherein the first initialization signal line and the second initialization signal line are arranged to be spaced apart in the second direction.

* * * * *